United States Patent
Varadarajan et al.

(10) Patent No.: US 10,297,442 B2
(45) Date of Patent: May 21, 2019

(54) REMOTE PLASMA BASED DEPOSITION OF GRADED OR MULTI-LAYERED SILICON CARBIDE FILM

(71) Applicant: Lam Research Corporation, Fremont, CA (US)

(72) Inventors: Bhadri N. Varadarajan, Beaverton, OR (US); Bo Gong, Sherwood, OR (US); Guangbi Yuan, Beaverton, OR (US); Zhe Gui, Beaverton, OR (US); Fengyuan Lai, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 61 days.

(21) Appl. No.: 15/283,159

(22) Filed: Sep. 30, 2016

(65) Prior Publication Data

US 2018/0096842 A1    Apr. 5, 2018
US 2018/0240664 A9    Aug. 23, 2018

Related U.S. Application Data

(60) Continuation-in-part of application No. 14/961,637, filed on Dec. 7, 2015, which is a division of
(Continued)

(51) Int. Cl.
*H01L 21/02*    (2006.01)
*C23C 16/50*    (2006.01)
(Continued)

(52) U.S. Cl.
CPC ........ *H01L 21/02216* (2013.01); *C23C 14/48* (2013.01); *C23C 16/325* (2013.01);
(Continued)

(58) Field of Classification Search
CPC ......... H01L 21/02126; H01L 21/02274; H01L 21/02216; H01L 21/31633; C26C 16/50;
(Continued)

(56) References Cited

U.S. PATENT DOCUMENTS 4,177,474 A    12/1979   Ovshinsky
4,656,110 A    4/1987   Yamazaki
(Continued)

FOREIGN PATENT DOCUMENTS

CA    868641 A    4/1971
CN    1714168 A    12/2005
(Continued)

OTHER PUBLICATIONS

Varadarajan et al., U.S. Appl. No. 15/382,13,7 filed Dec. 16, 2016 entitled "Densification of Silicon Carbide Film Using Remote Plasma Treatment.".
(Continued)

*Primary Examiner* — Marvin Payen
*Assistant Examiner* — Jeremy J Joy
(74) *Attorney, Agent, or Firm* — Weaver Austin Villeneuve & Sampson LLP

(57) ABSTRACT

Provided are methods and apparatuses for depositing a graded or multi-layered silicon carbide film using remote plasma. A graded or multi-layered silicon carbide film can be formed under process conditions that provide one or more organosilicon precursors onto a substrate in a reaction chamber. Radicals of source gas in a substantially low energy state, such as radicals of hydrogen in the ground state, are provided from a remote plasma source into reaction chamber. In addition, co-reactant gas is flowed towards the reaction chamber. In some implementations, radicals of the co-reactant gas are provided from the remote plasma source into the reaction chamber. A flow rate of the co-reactant gas
(Continued)

can be changed over time, incrementally or gradually, to form a multi-layered silicon carbide film or a graded silicon carbide film having a composition gradient from a first surface to a second surface of the graded silicon carbide film.

20 Claims, 9 Drawing Sheets

Related U.S. Application Data application No. 13/907,699, filed on May 31, 2013, now Pat. No. 9,234,276.

(51) Int. Cl.

| | | |
|---|---|---|
| *C23C 16/455* | (2006.01) | |
| *C23C 16/40* | (2006.01) | |
| *C23C 16/32* | (2006.01) | |
| *C23C 14/48* | (2006.01) | |
| *H01J 37/32* | (2006.01) | |
| *H01L 29/49* | (2006.01) | |
| *H01L 21/768* | (2006.01) | |
| *H01L 29/78* | (2006.01) | |

(52) U.S. Cl.
CPC ...... *C23C 16/401* (2013.01); *C23C 16/45523* (2013.01); *C23C 16/45525* (2013.01); *C23C 16/50* (2013.01); *H01J 37/32009* (2013.01); *H01J 37/3244* (2013.01); *H01L 21/02126* (2013.01); *H01L 21/02274* (2013.01); *H01L 21/768* (2013.01); *H01L 29/4983* (2013.01); *H01L 29/78* (2013.01); *H01J 2237/334* (2013.01)

(58) Field of Classification Search
CPC .. C26C 16/45525; C26C 16/45536–16/45542; C23C 16/50; C23C 16/45536–16/45542
See application file for complete search history.

(56) References Cited

U.S. PATENT DOCUMENTS

| | | | |
|---|---|---|---|
| 4,895,789 | A | 1/1990 | Motte et al. |
| 4,952,658 | A | 8/1990 | Kalchauer et al. |
| 5,034,355 | A | 7/1991 | Tani et al. |
| 5,108,965 | A | 4/1992 | Tani et al. |
| 5,324,690 | A | 6/1994 | Gelatos et al. |
| 5,447,816 | A | 9/1995 | Kodama et al. |
| 5,464,699 | A | 11/1995 | Baldi |
| 5,518,572 | A | 5/1996 | Kinoshita et al. |
| 5,567,243 | A | 10/1996 | Foster et al. |
| 5,654,208 | A | 8/1997 | Harris et al. |
| 5,739,579 | A | 4/1998 | Chiang et al. |
| 5,958,324 | A | 9/1999 | Bujalski et al. |
| 6,045,877 | A | 4/2000 | Gleason et al. |
| 6,100,587 | A | 8/2000 | Merchant et al. |
| 6,150,719 | A | 11/2000 | Saia et al. |
| 6,159,871 | A | 12/2000 | Loboda et al. |
| 6,197,688 | B1 | 3/2001 | Simpson |
| 6,242,686 | B1 | 6/2001 | Kishimoto et al. |
| 6,262,445 | B1 | 7/2001 | Swanson et al. |
| 6,316,167 | B1 | 11/2001 | Angelopoulos et al. |
| 6,352,945 | B1 | 3/2002 | Matsuki |
| 6,365,527 | B1 | 4/2002 | Yang et al. |
| 6,383,299 | B1 | 5/2002 | Yuda et al. |
| 6,383,898 | B1 | 5/2002 | Kishimoto |
| 6,383,955 | B1 | 5/2002 | Matsuki et al. |
| 6,399,484 | B1 | 6/2002 | Yamazaki et al. |
| 6,410,419 | B1 | 6/2002 | Merchant et al. |
| 6,417,092 | B1 | 7/2002 | Jain et al. |
| 6,424,044 | B1 | 7/2002 | Han et al. |
| 6,432,846 | B1 | 8/2002 | Matsuki |
| 6,448,186 | B1 | 9/2002 | Olson et al. |
| 6,455,409 | B1 | 9/2002 | Subramanian et al. |
| 6,465,366 | B1 | 10/2002 | Nemani et al. |
| 6,465,372 | B1 | 10/2002 | Xia et al. |
| 6,506,692 | B2 | 1/2003 | Andideh |
| 6,576,345 | B1 | 6/2003 | Van Cleemput et al. |
| 6,624,064 | B1 | 9/2003 | Sahin et al. |
| 6,670,715 | B2 | 12/2003 | Yang et al. |
| 6,764,958 | B1 | 7/2004 | Nemani et al. |
| 6,767,836 | B2 | 7/2004 | San et al. |
| 6,774,489 | B2 | 8/2004 | Russell et al. |
| 6,790,767 | B2 | 9/2004 | Lee |
| 6,790,788 | B2 | 9/2004 | Li et al. |
| 6,849,561 | B1 | 2/2005 | Goundar |
| 6,855,645 | B2 | 2/2005 | Tang et al. |
| 6,875,687 | B1 | 4/2005 | Weidman et al. |
| 6,881,683 | B2 | 4/2005 | Matsuki et al. |
| 6,890,850 | B2 | 5/2005 | Lee et al. |
| 6,930,013 | B2 | 8/2005 | Choi et al. |
| 6,967,405 | B1 | 11/2005 | Yu et al. |
| 7,064,088 | B2 | 6/2006 | Hyodo et al. |
| 7,091,137 | B2 | 8/2006 | Lee et al. |
| 7,115,534 | B2 | 10/2006 | Nguyen et al. |
| 7,163,889 | B2 | 1/2007 | Yu et al. |
| 7,200,460 | B2 | 4/2007 | Campana et al. |
| 7,239,017 | B1 | 7/2007 | Yu et al. |
| 7,253,125 | B1 | 8/2007 | Bandyopadhyay et al. |
| 7,256,139 | B2 | 8/2007 | Moghadam et al. |
| 7,282,438 | B1 | 10/2007 | Yu et al. |
| 7,381,662 | B1 | 6/2008 | Niu et al. |
| 7,420,275 | B1 | 9/2008 | Yu et al. |
| 7,468,290 | B2 | 12/2008 | Lukas et al. |
| 7,524,735 | B1* | 4/2009 | Gauri .................... C23C 16/045 438/436 |
| 7,573,061 | B1 | 8/2009 | Yu et al. |
| 7,842,604 | B1 | 11/2010 | Yu et al. |
| 7,915,166 | B1 | 3/2011 | Yu et al. |
| 7,923,385 | B2 | 4/2011 | Wu et al. |
| 7,968,436 | B1 | 6/2011 | Yu et al. |
| 8,124,522 | B1 | 2/2012 | Wu et al. |
| 8,173,537 | B1 | 5/2012 | Chattopadhyay et al. |
| 8,178,443 | B2 | 5/2012 | Rangarajan et al. |
| 8,247,332 | B2 | 8/2012 | Rangarajan et al. |
| 8,669,181 | B1 | 3/2014 | Yu et al. |
| 8,846,525 | B2 | 9/2014 | Rangarajan et al. |
| 8,927,442 | B1* | 1/2015 | Angyal ............ H01L 21/76801 257/639 |
| 9,234,276 | B2 | 1/2016 | Varadarajan |
| 9,337,068 | B2 | 5/2016 | Antonelli et al. |
| 9,371,579 | B2 | 6/2016 | Varadarajan et al. |
| 9,391,086 | B1 | 7/2016 | Soda et al. |
| 9,837,270 | B1 | 12/2017 | Varadarajan et al. |
| 10,002,787 | B2 | 6/2018 | Yu et al. |
| 2001/0021491 | A1 | 9/2001 | Chen et al. |
| 2002/0000202 | A1 | 1/2002 | Yuda et al. |
| 2002/0016085 | A1 | 2/2002 | Huang et al. |
| 2002/0019148 | A1 | 2/2002 | Hawryluk et al. |
| 2002/0024117 | A1 | 2/2002 | Russell et al. |
| 2002/0039625 | A1 | 4/2002 | Powell et al. |
| 2002/0106891 | A1 | 8/2002 | Kim et al. |
| 2002/0132101 | A1 | 9/2002 | Fonash et al. |
| 2003/0001275 | A1 | 1/2003 | Sambucetti et al. |
| 2003/0008528 | A1 | 1/2003 | Xia et al. |
| 2003/0036215 | A1 | 2/2003 | Reid |
| 2003/0049460 | A1 | 3/2003 | O'Neill et al. |
| 2003/0057553 | A1 | 3/2003 | DelaRosa et al. |
| 2003/0064154 | A1 | 4/2003 | Laxman et al. |
| 2003/0068881 | A1 | 4/2003 | Xia et al. |
| 2003/0082296 | A1 | 5/2003 | Elers et al. |
| 2003/0089992 | A1 | 5/2003 | Rathi et al. |
| 2003/0162033 | A1 | 8/2003 | Johnson et al. |
| 2003/0176030 | A1* | 9/2003 | Tsuji .................... C23C 16/401 438/200 |
| 2003/0194496 | A1 | 10/2003 | Xu et al. |
| 2003/0232150 | A1 | 12/2003 | Arnold et al. |
| 2003/0232514 | A1 | 12/2003 | Kim et al. |
| 2004/0067308 | A1 | 4/2004 | Zheng et al. |
| 2004/0084680 | A1 | 5/2004 | Ruelke et al. |

(56) References Cited

U.S. PATENT DOCUMENTS

| | | |
|---|---|---|
| 2004/0084774 A1 | 5/2004 | Li et al. |
| 2004/0089924 A1 | 5/2004 | Yuasa et al. |
| 2004/0113279 A1 | 6/2004 | Chen et al. |
| 2004/0115954 A1* | 6/2004 | Todd .................. C23C 16/30 438/781 |
| 2004/0121085 A1* | 6/2004 | Wang .................. C23C 16/34 427/569 |
| 2004/0124531 A1 | 7/2004 | Venkatraman et al. |
| 2004/0161535 A1 | 8/2004 | Goundar et al. |
| 2004/0178169 A1 | 9/2004 | Desphande et al. |
| 2004/0194706 A1 | 10/2004 | Wang |
| 2004/0207084 A1 | 10/2004 | Hedrick et al. |
| 2004/0232552 A1 | 11/2004 | Wang et al. |
| 2005/0014361 A1 | 1/2005 | Nguyen et al. |
| 2005/0042889 A1 | 2/2005 | Lee et al. |
| 2005/0100682 A1 | 5/2005 | Fukiage et al. |
| 2005/0202685 A1 | 9/2005 | Huang et al. |
| 2005/0230831 A1* | 10/2005 | Clevenger ......... H01L 21/02126 257/751 |
| 2005/0233555 A1 | 10/2005 | Rajagopalan et al. |
| 2005/0236711 A1 | 10/2005 | Wang et al. |
| 2005/0245071 A1 | 11/2005 | Wu et al. |
| 2005/0255714 A1 | 11/2005 | Iyer et al. |
| 2005/0277302 A1 | 12/2005 | Nguyen et al. |
| 2005/0287790 A1* | 12/2005 | Owada .................. C23C 16/30 438/622 |
| 2005/0287811 A1 | 12/2005 | Inukai |
| 2006/0014384 A1* | 1/2006 | Lee .................. C23C 16/0245 438/680 |
| 2006/0014399 A1* | 1/2006 | Joe .................. C23C 16/30 438/791 |
| 2006/0019486 A1 | 1/2006 | Yu et al. |
| 2006/0040507 A1 | 2/2006 | Mak et al. |
| 2006/0046520 A1* | 3/2006 | Padhi .................. C23C 16/029 438/778 |
| 2006/0091559 A1* | 5/2006 | Nguyen ............ H01L 21/02126 257/775 |
| 2006/0110931 A1 | 5/2006 | Fukazawa et al. |
| 2006/0160376 A1* | 7/2006 | Padhi .................. C23C 16/029 438/789 |
| 2006/0216916 A1 | 9/2006 | Tsai et al. |
| 2006/0252273 A1* | 11/2006 | Lakshmanan ......... C23C 16/029 438/758 |
| 2007/0004204 A1 | 1/2007 | Fukazawa et al. |
| 2007/0141812 A1 | 6/2007 | Zagwijn et al. |
| 2007/0166546 A1 | 7/2007 | Ichikawa et al. |
| 2007/0190266 A1* | 8/2007 | Fu .................. H01L 21/02063 427/569 |
| 2007/0232071 A1 | 10/2007 | Balseanu et al. |
| 2007/0264839 A1 | 11/2007 | Van Gompel et al. |
| 2007/0281496 A1* | 12/2007 | Ingle .................. C23C 16/401 438/778 |
| 2007/0281497 A1 | 12/2007 | Liu et al. |
| 2008/0050933 A1 | 2/2008 | Ozaki et al. |
| 2008/0063809 A1 | 3/2008 | Lee et al. |
| 2008/0064173 A1 | 3/2008 | Hung |
| 2008/0070396 A1 | 3/2008 | Budrevich et al. |
| 2008/0099754 A1 | 5/2008 | Enicks |
| 2008/0122103 A1 | 5/2008 | Bonilla et al. |
| 2008/0128907 A1 | 6/2008 | Yang et al. |
| 2008/0173984 A1 | 7/2008 | Lin et al. |
| 2008/0217746 A1 | 9/2008 | Morita et al. |
| 2008/0233366 A1* | 9/2008 | Edelstein ............ C23C 16/0272 428/201 |
| 2008/0254641 A1 | 10/2008 | Kobayashi et al. |
| 2008/0277765 A1 | 11/2008 | Lane et al. |
| 2009/0017227 A1* | 1/2009 | Fu .................. C23C 16/0245 427/569 |
| 2009/0042402 A1 | 2/2009 | Morioka |
| 2009/0082240 A1 | 3/2009 | Nukui et al. |
| 2009/0215282 A1 | 8/2009 | Moore et al. |
| 2009/0218699 A1 | 9/2009 | Torres et al. |
| 2009/0258487 A1 | 10/2009 | Lin et al. |
| 2009/0294925 A1 | 12/2009 | Lin et al. |
| 2009/0325364 A1* | 12/2009 | Sasagawa ......... H01L 21/76254 438/458 |
| 2010/0075077 A1 | 3/2010 | Bicker et al. |
| 2010/0081293 A1* | 4/2010 | Mallick .................. C23C 16/325 438/794 |
| 2010/0207274 A1 | 8/2010 | Hayashi et al. |
| 2010/0255667 A1 | 10/2010 | Seino et al. |
| 2010/0308463 A1* | 12/2010 | Yu .................. H01L 21/02074 257/753 |
| 2011/0027957 A1 | 2/2011 | Berry |
| 2011/0045676 A1 | 2/2011 | Park et al. |
| 2011/0074044 A1* | 3/2011 | Lin .................. G03F 7/0757 257/776 |
| 2011/0111533 A1 | 5/2011 | Varadarajan et al. |
| 2011/0111590 A1 | 5/2011 | Edelstein et al. |
| 2011/0114994 A1 | 5/2011 | Mandlik et al. |
| 2011/0117678 A1 | 5/2011 | Varadarajan et al. |
| 2011/0135557 A1 | 6/2011 | Rangarajan et al. |
| 2011/0146568 A1 | 6/2011 | Haukka et al. |
| 2011/0180866 A1 | 7/2011 | Matsuda et al. |
| 2011/0193230 A1 | 8/2011 | Nogami et al. |
| 2011/0204492 A1* | 8/2011 | Xie .................. C23C 16/30 257/635 |
| 2012/0077349 A1* | 3/2012 | Li .................. C23C 16/45542 438/762 |
| 2012/0122302 A1* | 5/2012 | Weidman ............ C23C 16/325 438/478 |
| 2012/0241089 A1 | 9/2012 | Dielmann et al. |
| 2012/0329287 A1* | 12/2012 | Gates .................. C23C 16/401 438/781 |
| 2013/0043514 A1* | 2/2013 | Grill .................. H01L 21/02126 257/288 |
| 2013/0056818 A1 | 3/2013 | Iino et al. |
| 2013/0119406 A1 | 5/2013 | Notsu et al. |
| 2013/0129940 A1 | 5/2013 | Xiao et al. |
| 2013/0157466 A1 | 6/2013 | Fox et al. |
| 2013/0242493 A1 | 9/2013 | Shenoy et al. |
| 2013/0319290 A1* | 12/2013 | Xiao .................. H01L 21/02211 106/287.11 |
| 2013/0330932 A1 | 12/2013 | Rangarajan et al. |
| 2013/0330935 A1* | 12/2013 | Varadarajan ............ C23C 16/50 438/786 |
| 2014/0175617 A1 | 6/2014 | Antonelli et al. |
| 2014/0197470 A1 | 7/2014 | Lee et al. |
| 2014/0264780 A1* | 9/2014 | Yim .................. H01L 29/06 257/632 |
| 2014/0264925 A1 | 9/2014 | Chen |
| 2014/0302690 A1* | 10/2014 | Underwood ...... H01L 21/02126 438/787 |
| 2014/0356549 A1* | 12/2014 | Varadarajan .......... C23C 16/325 427/568 |
| 2015/0118394 A1 | 4/2015 | Varadarajan et al. |
| 2015/0179466 A1 | 6/2015 | Takayama et al. |
| 2015/0303056 A1* | 10/2015 | Varadarajan ...... H01L 21/02167 438/790 |
| 2016/0020089 A1* | 1/2016 | Thadani ......... H01L 21/02126 438/786 |
| 2016/0090649 A1 | 3/2016 | Varadarajan |
| 2016/0268286 A1 | 9/2016 | Tamura |
| 2016/0276140 A1 | 9/2016 | Varadarajan et al. |
| 2016/0284615 A1 | 9/2016 | Kitajima et al. |
| 2016/0314964 A1 | 10/2016 | Tang et al. |
| 2017/0365462 A1 | 12/2017 | Varadarajan et al. |
| 2018/0144977 A1 | 5/2018 | Yu et al. |
| 2018/0330945 A1 | 11/2018 | Varadarajan et al. |
| 2018/0330985 A1 | 11/2018 | Yu et al. |

FOREIGN PATENT DOCUMENTS

| | | |
|---|---|---|
| CN | 1735945 A | 2/2006 |
| CN | 101017834 A | 8/2007 |
| CN | 101065834 A | 10/2007 |
| CN | 101111930 A | 1/2008 |
| CN | 101536191 A | 9/2009 |
| CN | 102171796 A | 8/2011 |
| CN | 102187450 A | 9/2011 |
| CN | 102468434 A | 5/2012 |

(56) References Cited

FOREIGN PATENT DOCUMENTS

| | | |
|---|---|---|
| CN | 102652353 A | 8/2012 |
| EP | 1 172 845 A2 | 1/2002 |
| EP | 1 186 685 A2 | 3/2002 |
| JP | 10-092742 | 4/1998 |
| JP | 2001-160547 | 6/2001 |
| JP | 2002-176100 | 6/2002 |
| JP | 2002-217189 | 8/2002 |
| JP | 2004-247725 | 9/2004 |
| JP | 2005-051096 A | 2/2005 |
| JP | 2007-158000 | 6/2007 |
| JP | 2008-529296 | 7/2008 |
| KR | 10-2006-0134964 | 12/2006 |
| KR | 10-2009-0121361 | 11/2009 |
| KR | 10-1334640 B1 | 11/2013 |
| TW | 476807 B | 2/2002 |
| TW | 535253 B | 6/2003 |
| TW | 200405437 | 4/2004 |
| TW | 200600984 | 1/2006 |
| TW | 200803988 | 1/2008 |
| TW | 200839884 | 10/2008 |
| TW | 200903635 A | 1/2009 |
| TW | 200908138 | 2/2009 |
| TW | 201124553 A | 7/2011 |
| TW | 201214512 A1 | 4/2012 |
| TW | 201214563 A | 4/2012 |
| TW | 201240012 A1 | 10/2012 |
| TW | 201405659 A | 2/2014 |
| WO | WO 2007/116492 | 10/2007 |

OTHER PUBLICATIONS

Wu et al., U.S. Appl. No. 11/693,66,1 filed Mar. 29, 2007 entitled "Methods for Improving Performance of ODC Film With Dielectric Constant < 4.0 .".

U.S. Office Action dated Dec. 19, 2014 issued in U.S. Appl. No. 13/907,699.

U.S. Final Office Action dated May 14, 2015 issued in U.S. Appl. No. 13/907,699.

U.S. Advisory Action and Examiner Initiated Interview Summary dated Aug. 12, 2015 issued in U.S. Appl. No. 13/907,699.

U.S. Notice of Allowance dated Sep. 10, 2015 issued in U.S. Appl. No. 13/907,699.

U.S. Office Action dated Sep. 15, 2015 issued in U.S. Appl. No. 14/062,648.

U.S. Notice of Allowance dated Feb. 19, 2016 issued in U.S. Appl. No. 14/062,648.

U.S. Office Action dated Nov. 2, 2015 issued in U.S. Appl. No. 14/616,435.

U.S. Final Office Action dated Mar. 10, 2016 issued in U.S. Appl. No. 14/616,435.

U.S. Office Action dated Jul. 8, 2016 issued in U.S. Appl. No. 14/616,435.

U.S. Office Action dated Sep. 12, 2016 issued in U.S. Appl. No. 14/692,627.

U.S. Office Action dated Feb. 24, 2005 issued in U.S. Appl. No. 10/670,660.

U.S. Notice of Allowance dated Sep. 11, 2006 issued in U.S. Appl. No. 11/234,808.

U.S. Office Action dated May 3, 2006 issued in U.S. Appl. No. 10/915,117.

U.S. Final Office Action dated Sep. 7, 2006 issued in U.S. Appl. No. 10/915,117.

U.S. Office Action dated Dec. 11, 2006 issued in U.S. Appl. No. 10/915,117.

U.S. Notice of Allowance dated Feb. 26, 2007 issued in U.S. Appl. No. 10/915,117.

U.S. Office Action dated May 1, 2008 issued in U.S. Appl. No. 11/373,847.

U.S. Notice of Allowance and Allowed Claims dated Jul. 1, 2008 issued in U.S. Appl. No. 11/373,847.

U.S. Office Action dated Apr. 10, 2009 issued in U.S. Appl. No. 11/805,356.

U.S. Final Office Action dated Oct. 13, 2009 issued in U.S. Appl. No. 11/805,356.

U.S. Office Action dated Apr. 8, 2010 issued in U.S. Appl. No. 11/805,356.

U.S. Notice of Allowance and Allowed Claims dated Jul. 26, 2010 issued in U.S. Appl. No. 11/805,356.

U.S. Office Action dated Sep. 6, 2006 issued in U.S. Appl. No. 10/869,474.

U.S. Office Action dated Feb. 9, 2007 issued in U.S. Appl. No. 10/869,474.

U.S. Final Office Action dated Jun. 28, 2007 issued in U.S. Appl. No. 10/869,474.

U.S. Notice of Allowance dated Jul. 26, 2007 issued in U.S. Appl. No. 10/869,474.

U.S. Office Action dated Mar. 17, 2008 issued in U.S. Appl. No. 11/893,490.

U.S. Office Action dated Aug. 8, 2008 issued in U.S. Appl. No. 11/893,490.

U.S. Office Action (Ex Parte Quayle) dated Jan. 27, 2009 issued in U.S. Appl. No. 11/893,490.

U.S. Notice of Allowance dated May 4, 2009 issued in U.S. Appl. No. 11/893,490.

U.S. Office Action dated Oct. 15, 2010 issued in U.S. Appl. No. 12/497,322.

U.S. Notice of Allowance and Allowed Claims dated Mar. 11, 2011 issued in U.S. Appl. No. 12/497,322.

U.S. Office Action dated Nov. 20, 2009 issued in U.S. Appl. No. 11/710,652.

U.S. Final Office Action dated Apr. 15, 2010 issued in U.S. Appl. No. 11/710,652.

U.S. Office Action dated Aug. 5, 2010 issued in U.S. Appl. No. 11/710,652.

U.S. Notice of Allowance and Allowed Claims dated Nov. 24, 2010 issued in U.S. Appl. No. 11/710,652.

U.S. Office Action dated Jul. 9, 2013 issued in U.S. Appl. No. 11/710,652.

U.S. Notice of Allowance dated Oct. 25, 2013 issued in U.S. Appl. No. 11/710,652.

U.S. Office Action dated Aug. 28, 2009 issued in U.S. Appl. No. 11/693,661.

U.S. Office Action dated Feb. 24, 2010 issued in U.S. Appl. No. 11/693,661.

U.S. Final Office Action dated Nov. 5, 2010 issued in U.S. Appl. No. 11/693,661.

U.S. Office Action dated Dec. 31, 2008 issued in U.S. Appl. No. 11/693,617.

U.S. Office Action dated Oct. 7, 2009 issued in U.S. Appl. No. 11/693,617.

U.S. Office Action dated Jun. 10, 2010 issued in U.S. Appl. No. 11/693,617.

U.S. Final Office Action dated Jan. 20, 2011 issued in U.S. Appl. No. 11/693,617.

U.S. Office Action dated Sep. 16, 2011 issued in U.S. Appl. No. 11/693,617.

U.S. Notice of Allowance dated Jan. 9, 2012 issued in U.S. Appl. No. 11/693,617.

U.S. Office Action dated Jan. 12, 2011 issued in U.S. Appl. No. 12/082,496.

U.S. Final Office Action dated Aug. 4, 2011 issued in U.S. Appl. No. 12/082,496.

U.S. Notice of Allowance dated Oct. 26, 2011 issued in U.S. Appl. No. 12/082,496.

U.S. Notice of Allowance dated Apr. 10, 2012 issued in U.S. Appl. No. 12/631,691.

U.S. Office Action dated Feb. 7, 2014 issued in U.S. Appl. No. 13/967,832.

U.S. Notice of Allowance dated May 30, 2014 issued in U.S. Appl. No. 13/967,832.

U.S. Notice of Allowance dated Sep. 5, 2014 issued in U.S. Appl. No. 13/967,832.

(56) References Cited

OTHER PUBLICATIONS

U.S. Office Action dated Sep. 29, 2015 issued in U.S. Appl. No. 14/105,026.
U.S. Notice of Allowance dated Jan. 29, 2016 issued in U.S. Appl. No. 14/105,026.
U.S. Office Action dated Feb. 7, 2014 issued in U.S. Appl. No. 13/494,836.
U.S. Final Office Action dated Aug. 21, 2014 issued in U.S. Appl. No. 13/494,836.
U.S. Office Action dated May 5, 2015 issued in U.S. Appl. No. 13/494,836.
U.S. Final Office Action dated Nov. 16, 2015 issued in U.S. Appl. No. 13/494,836.
U.S. Office Action dated Mar. 10, 2016 issued in U.S. Appl. No. 13/494,836.
U.S. Final Office Action dated Jul. 11, 2016 issued in U.S. Appl. No. 13/494,836.
U.S. Office Action dated Jan. 9, 2017 issued in U.S. Appl. No. 13/494,836.
Chinese First Office Action dated Sep. 5, 2016 issued in Application No. CN 201410576747.1.
Chinese First Office Action dated Jan. 24, 2014 issued in Application No. CN 201010569747.0.
Chinese Second Office Action dated Aug. 14, 2014 issued in Application No. CN 201010569747.0.
Chinese Third Office Action dated Jan. 13, 2015 issued in Application No. CN 201010569747.0.
Japanese Office Action dated Jul. 29, 2014 issued in Application No. JP 2010-256165.
Taiwan Notice of Allowance and Search Report dated Jul. 8, 2015 issued in Application No. TW 099140866.
Taiwan Office Action dated Jan. 14, 2016 issued in Application No. TW 104126278.
Taiwan Office Action dated Dec. 22, 2015 issued in Application No. TW 102120742.
Benilan et al., (Oct. 4, 2011) "Optimization of microwave Hydrogen plasma discharges to mimic Lyman α(121.6 nm) solar irradiations," *EPSC-DPS2011-1317, EPSC-DPJ Joint Meeting 2011, EPSC Abstracts*, 6:2pp.
Blaszczyk-Lezak et al., (2005) "Silicon Carbonitride Films Produced by Remote Hydrogen Microwave Plasma CVD Using a (Dimethylamino)dimethylsilane Precursor," *Chemical Vapor Deposition*, 11(1):44-52.
"Development of Current Atomic Theory," Emission Spectrum of Hydrogen, [downloaded at http://chemed.chem.purdue.edu/genchem/topicreview/bp/ch6/bohr.html on Sep. 23, 2015], 7 pp.
"Dummies' Guide to Hydrogen," *Molecular Hydrogen Foundation, MHF*, [downloaded at http://www.molecularhydrogenfoundation.org/core-information/dummies-guide-to-hydrogen on Sep. 23, 2015], 2 pp.
Fozza et al., (Jan./Feb. 1998) "Vacuum ultraviolet to visible emission of some pure gases and their mixtures used for plasma processing," *J. Vac. Sci. Technol. A, American Vacuum Society*, 16(1):72-77.
Grubbs et al. (May/Jun. 2006) "Attenuation of hydrogen radicals traveling under flowing gas conditions through tubes of different materials," *J. Vac. Sci. Technol. A*, 24(3):486-496.
Hatanaka et al., (2000) "Experiments and analyses of SiC thin film deposition from organo-silicon by a remote plasma method," *Thin Solid Films*, 368:287-291.
Huran, J., et al., (2004) "RBS study of amorphous silicon carbide films deposited by PECVD," *Czechoslovak Journal of Physics*, 54(Suppl. C):C1006-C1010.
"Radical (chemistry)" From Wikipedia, the free encyclopedia, [downloaded at http://en.wikipedia.org/wiki/Radical_(chemistry) on 9/23/15), 11 pages.
Xu, Ying-Yu, et al., (1999) "Preparation of SiC Thin Film Using Organosilicon by Remote Plasma CVD Method," *Mat. Res. Soc. Symp. Proc.*, 544:185-189.
Jones et al., (Nov. 30, 2001) "Silicon Containing Polymers: The Science and Technology of Their Synthesis and Applications," *Springer*, p. 705.
Lemaire, P.J., Walker, K.L., Kranz, K.S., Huff, R.G. and DiMarcello, F.V., (1990) "Diffusion of Hydrogen Through Hermetic Carbon Films on Silica Fibers," AT&T Bell Laboratories, 600 Mountain Avenue, Murray Hill, NJ 07974, *Mat. Res. Soc. Symp. Proc.* vol. 172, 12 pages, © 1990 Materials Research Society.
Maeda et al. (Sep. 1989), "A Low-Permittivity Interconnection Using an SiBN Interlayer," *IEEE Transactions on Electron Devices* 36(9).
Sugino, Takashi et al. (2001), "Synthesis of boron nitride film with low dielectric constant for its application to silicon ultralarge scale integrated semiconductors," *Diamond and Related Materials*, pp. 1275-1379, Elsevier Science B.V.
Wróbel et al. (2001) "Oligomerization and Polymerization Steps in Remote Plasma Chemical Vapor Deposition of Silicon-Carbon and Silica Films from Organosilicon Sources," *Chem. Mater*, 13(5):1884-1895.
Wróbel et al., (2010) "Reactivity of Organosilicon Precursors in Remote Hydrogen Microwave Plasma Chemical Vapor Deposition of Silicon Carbide and Silicon Carbonitride Thin-Film Coatings," *Appl. Organometal. Chem.*, 24:201-207.
Wu et al. (Oct. 17-19, 2006), "Ultra Low k Dielectrics Prepared by PECVD Using a Single-Precursor and Treated by UV Assisted Thermal Processing," *Advanced Metallization Conference (AMC)* 2006, pp. 1-6, San Diego, CA.
U.S. Office Action dated Feb. 5, 2018 issued in U.S. Appl. No. 14/961,637.
U.S. Final Office Action dated Feb. 22, 2017 issued in U.S. Appl. No. 14/616,435.
U.S. Examiner's Answer to the Appeal brief [filed May 19, 2017] before the Patent Trial and Appeal Board dated Sep. 22, 2017 issued in U.S. Appl. No. 14/616,435.
U.S. Final Office Action, dated May 19, 2017, issued in U.S. Appl. No. 14/692,627.
U.S. Office Action dated Nov. 8, 2017 issued in U.S. Appl. No. 14/692,627.
U.S. Office Action dated Jul. 7, 2017 issued in U.S. Appl. No. 15/382,137.
U.S. Notice of Allowance dated Sep. 22, 2017 issued in U.S. Appl. No. 15/382,137.
U.S. Examiner's Answer to the Appeal brief [filed Apr. 28, 2017] before the Patent Trial and Appeal Board dated Sep. 25, 2017 issued in U.S. Appl. No. 13/494,836.
Taiwan Office Action dated Nov. 6, 2017 issued in Application No. TW 103119100.
Singapore Notice of Allowance & Supplemental Exam Report dated Nov. 30, 2017 issued in Application No. SG 10201402381U.
Chinese First Office Action dated Jan. 3, 2018 issued in Application No. CN 201610084166.5.
Chinese First Office Action dated Jul. 3, 2017 issued in Application No. CN 201510566292.X.
Korean Office Action dated Feb. 20, 2017 issued in Application No. KR 10-2010-0123145.
Korean First Office Action dated Feb. 1, 2018 issued in Application No. KR 10-2017-0147917.
Taiwan Examination Report dated Mar. 14, 2017 issued in Application No. TW 102146997.
Taiwan Examination Report dated Aug. 8, 2017 issued in Application No. TW 102146997.
PCT International Search Report and Written Opinion (ISA/KR) dated Dec. 26, 2017 issued in PCT/US2017/051794.
U.S. Appl. No. 11/693,661, filed Mar. 29, 2007, Wu et al.
U.S. Appl. No. 15/408,291, filed Jan. 17, 2017, Yu et al.
U.S. Notice of Allowance dated Feb. 7, 2018 issued in U.S. Appl. No. 15/408,291.
U.S. Office Action dated Jul. 28, 2017 issued in U.S. Appl. No. 15/408,291.
U.S. Final Office Action dated Aug. 28, 2018 issued in U.S. Appl. No. 14/961,637.
U.S. Office Action dated Nov. 16, 2018 issued in U.S. Appl. No. 15/169,530.

(56) References Cited

OTHER PUBLICATIONS

U.S. Final Office Action dated May 16, 2018 issued in U.S. Appl. No. 14/692,627.
U.S. Notice of Allowance dated Oct. 2, 2018 issued in U.S. Appl. No. 13/494,836.
Taiwan Notice of Allowance and Search Report dated Jun. 14, 2018 issued in Application No. TW 103136697.
Chinese Second Office Action dated Oct. 12, 2018 issued in Application No. CN 201610084166.5.
Chinese First Office Action dated Jun. 25, 2018 issued in Application No. CN 201610251266.2.
PCT International Search Report and Written Opinion (ISA/KR) dated Mar. 15, 2018 issued in PCT/US2017/062882.
PCT International Search Report and Written Opinion (ISA/KR) dated Mar. 19, 2018 issued in PCT/US2017/064024.
U.S. Appl. No. 16/044,357, filed Jul. 24, 2018, Weimer et al.
U.S. Appl. No. 16/041,153, filed Jul. 20, 2018, Weimer et al.
U.S. Appl. No. 16/194,102, filed Nov. 16, 2018, Tang et al.

* cited by examiner

REMOTE PLASMA BASED DEPOSITION OF GRADED OR MULTI-LAYERED SILICON CARBIDE FILM

CROSS-REFERENCE TO RELATED APPLICATIONS

This application is a continuation-in-part of U.S. patent application Ser. No. 14/961,637 by Varadarajan, titled "METHOD TO OBTAIN SiC CLASS OF FILMS OF DESIRED COMPOSITION AND FILM PROPERTIES," filed on Dec. 7, 2015, which is a divisional of U.S. patent application Ser. No. 13/907,699 (issued as U.S. Pat. No. 9,234,276) to Varadarajan, titled "METHOD TO OBTAIN SiC CLASS OF FILMS OF DESIRED COMPOSITION AND FILM PROPERTIES," filed May 31, 2013, each of which is incorporated by reference herein in its entirety and for all purposes.

BACKGROUND

The present disclosure relates generally to the formation of silicon carbide films, and more particularly to the deposition of graded or multi-layered silicon carbide films using remote plasma.

The silicon carbide (SiC) class of thin films has unique physical, chemical, and mechanical properties and is used in a variety of applications, particularly integrated circuit applications. Classes of SiC thin films include oxygen doped silicon carbide, also known as silicon oxycarbide, nitrogen doped silicon carbide, also known as silicon nitricarbide, and oxygen and nitrogen doped silicon carbide, also known as silicon oxynitricarbide.

SUMMARY

This disclosure pertains to a method of depositing a graded silicon carbide film. The method includes providing a substrate in a reaction chamber, flowing an organosilicon precursor onto the substrate, flowing a co-reactant gas towards the reaction chamber, providing a source gas in a plasma source that is remote from the reaction chamber, generating, from the source gas, one or more radicals of the source gas in the plasma source, and introducing the one or more radicals of the source gas onto the substrate. All or substantially all of the one or more radicals of the source gas are in a substantially low energy state that react with the organosilicon precursor. The method further includes changing a flow rate of the co-reactant gas over time to form a graded silicon carbide film, the graded silicon carbide film having a composition gradient from a first surface of the graded silicon carbide film to a second surface opposite the first surface of the graded silicon carbide film.

In some implementations, flowing the co-reactant gas towards the reaction chamber includes flowing the co-reactant gas through the plasma source. The method further includes generating, from the co-reactant gas, one or more radicals of the co-reactant gas in the plasma source, and introducing the one or more radicals of the co-reactant gas onto the substrate. In some implementations, flowing the co-reactant gas towards the reaction chamber includes flowing the co-reactant gas in an identical flow path as the organosilicon precursor. In some implementations, the co-reactant gas is oxygen gas. In some implementations, the graded silicon carbide film is a graded oxygen doped silicon carbide (SiCO) film. In some implementations, the composition gradient of the graded silicon carbide film can have an increasing concentration of carbon from the first surface to the second surface of the silicon carbide film. The concentration of carbon at the first surface of the graded silicon carbide film can be less than about 20% and the concentration of carbon at the second surface of the graded silicon carbide film can be greater than about 20%. In some implementations, the graded silicon carbide film is formed without a vacuum break. In some implementations, the radicals of the source gas are in the substantially low energy state include hydrogen atom radicals in the ground state.

This disclosure also pertains to an apparatus for depositing a graded silicon carbide film. The apparatus includes a reaction chamber, a plasma source remote from the reaction chamber, a substrate support for holding a substrate in the reaction chamber, and a controller configured with instructions for performing the following operations: providing the substrate in the reaction chamber, flowing an organosilicon precursor onto the substrate, flowing a co-reactant gas through the plasma source towards the reaction chamber, providing a source gas in the plasma source, generating, from the source gas, one or more radicals of the source gas in the plasma source, introducing the one or more radicals of the source gas onto the substrate, where all or substantially all of the one or more radicals of the source gas are in a substantially low energy state that react with the organosilicon precursor, and changing a flow rate of the co-reactant gas over time to form a graded silicon carbide film, the graded silicon carbide film having a composition gradient from a first surface to a second surface opposite the first surface of the graded silicon carbide film.

In some implementations, the controller is further configured with instructions to perform the following operations: generating, from the co-reactant gas, one or more radicals of the co-reactant gas in the plasma source, and introducing the one or more radicals of the co-reactant gas onto the substrate. In some implementations, the co-reactant gas is oxygen gas. In some implementations, the graded silicon carbide film is SiCO film. In some implementations, the composition gradient of the graded silicon carbide film can have an increasing concentration of carbon from the first surface to the second surface of the silicon carbide film. The concentration of carbon at the first surface of the graded silicon carbide film can be less than about 20% and the concentration of carbon at the second surface of the graded silicon carbide film can be greater than about 20%.

This disclosure also pertains to a method for depositing a multi-layered silicon carbide film. The method includes providing a substrate in a reaction chamber, flowing an organosilicon precursor onto the substrate, flowing a co-reactant gas towards the reaction chamber, providing a source gas in a plasma source that is remote from the reaction chamber, generating, from the source gas, one or more radicals of the source gas in the plasma source, and introducing the one or more radicals of the source gas onto the substrate. All or substantially all of the one or more radicals of the source gas are in a substantially low energy state that react with the organosilicon precursor. The method further includes incrementally changing a flow rate of the co-reactant gas over time to form a multi-layered silicon carbide film, the multi-layered silicon carbide film having a varying concentration across a thickness of the multi-layered silicon carbide film.

In some implementations, flowing the co-reactant gas towards the reaction chamber includes flowing the co-reactant gas through the plasma source. In some implementations, flowing the co-reactant gas towards the reaction chamber includes flowing the co-reactant gas in an identical flow path as the organosilicon precursor. In some implementations, the co-reactant gas includes carbon dioxide ($CO_2$), carbon monoxide (CO), water ($H_2O$), methanol ($CH_3OH$), oxygen ($O_2$), ozone ($O_3$), nitrogen ($N_2$), nitrous oxide ($N_2O$), ammonia ($NH_3$), diazene ($N_2H_2$), methane ($CH_4$), ethane ($C_2H_6$), acetylene ($C_2H_2$), ethylene ($C_2H_4$), diborane ($B_2H_6$), or combinations thereof. In some implementations, each layer of the multi-layered silicon carbide film has an increasing concentration of carbon from a first surface to a second surface opposite the first surface of the multi-layered silicon carbide film. In some implementations, the multi-layered silicon carbide film is formed without introducing a vacuum break. In some implementations, the radicals of the source gas in the substantially low energy state include hydrogen atom radicals in the ground state.

This disclosure pertains to a method of depositing a graded silicon carbide film. The method includes providing a substrate in a reaction chamber, flowing an organosilicon precursor onto the substrate, flowing a co-reactant gas towards the reaction chamber, providing a source gas in a plasma source that is remote from the reaction chamber, generating, from the source gas, one or more radicals of the source gas in the plasma source, and introducing the one or more radicals of the source gas onto the substrate. All or substantially all of the one or more radicals of the source gas are in a substantially low energy state that react with the organosilicon precursor. The method further includes changing a flow rate of the organosilicon precursor over time to form a graded silicon carbide film, the graded silicon carbide film having a composition gradient from a first surface of the graded silicon carbide film to a second surface opposite the first surface of the graded silicon carbide film.

In some implementations, changing the flow rate of the organosilicon precursor over time occurs without changing a flow rate of the co-reactant gas or the source gas. In some implementations, flowing the co-reactant gas towards the reaction chamber includes flowing the co-reactant gas through the plasma source. In some implementations, flowing the co-reactant gas towards the reaction chamber includes flowing the co-reactant gas in an identical flow path as the organosilicon precursor. In some implementations, the graded silicon carbide film is SiCO film. In some implementations, the composition gradient of the graded silicon carbide film can have an increasing concentration of carbon from the first surface to the second surface of the silicon carbide film. The concentration of carbon at the first surface of the graded silicon carbide film can be less than about 20% and the concentration of carbon at the second surface of the graded silicon carbide film can be greater than about 20%. In some implementations, the graded silicon carbide film is formed without a vacuum break. In some implementations, the radicals of the source gas are in the substantially low energy state include hydrogen atom radicals in the ground state.

These and other embodiments are described further below with reference to the figures.

DETAILED DESCRIPTION

Figure 1A:
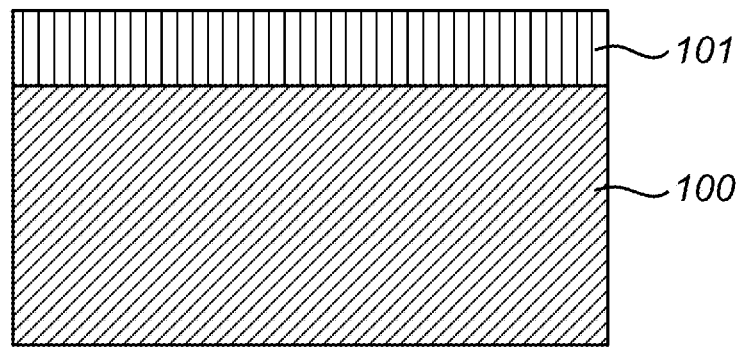
FIG. 1A illustrates a cross-section of an example silicon carbide film deposited over a substrate.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Introduction

Manufacture of semiconductor devices typically involves depositing one or more thin films on a substrate in an integrated fabrication process. In some aspects of the fabrication process, classes of thin films such as silicon carbide, silicon oxycarbide, silicon nitricarbide, and silicon oxynitricarbide are deposited using atomic layer deposition (ALD), chemical vapor deposition (CVD), plasma-enhanced chemical vapor deposition (PECVD), or any other suitable deposition method. As used herein, the term silicon carbide includes doped silicon carbides such as oxygen doped silicon carbide, nitrogen doped silicon carbide, and nitrogen and oxygen doped silicon carbide. For many, doped silicon carbides have at most about 50% atomic of dopant atoms, whether those atoms are oxygen, nitrogen, or atoms of another element. The doping level provides desired film properties.

One example class of thin films that can be deposited includes silicon oxycarbide. As used herein, silicon oxycarbide can refer to a chemical compound including silicon, oxygen, and carbon. Silicon oxycarbide may be used interchangeably with oxygen doped silicon carbide, which may include SiCO or SiOC films.

Precursor molecules for depositing silicon carbides can include silicon-containing molecules having silicon-hydrogen (Si—H) and/or silicon-silicon (Si—Si) bonds, and silicon-carbon (Si—C) bonds. Precursor molecules for depositing silicon oxycarbides include silicon-containing molecules having silicon-hydrogen (Si—H) bonds and/or silicon-silicon (Si—Si) bonds, and silicon-oxygen (Si—O) bonds and/or silicon-carbon (Si—C) bonds. Precursor molecules for depositing silicon nitricarbides include silicon-containing molecules having silicon-hydrogen (Si—H) bonds and/or silicon-silicon (Si—Si) bonds, and silicon-nitrogen (Si—N) bonds and/or silicon-carbon (Si—C) bonds. Precursor molecules for depositing silicon oxynitricarbides include silicon-containing molecules having silicon-hydrogen (Si—H) bonds and/or silicon-silicon (Si—Si) bonds, and silicon-nitrogen (Si—N) bonds, silicon-oxygen (Si—O) bonds, and/or silicon-carbon (Si—C) bonds. Current PECVD processes may use in situ plasma processing in which a plasma is provided directly adjacent to a substrate.

It has been found that depositing high-quality silicon carbide thin films can have certain challenges, such as providing films with excellent step coverage, low dielectric constants, high breakdown voltages, low leakage currents, high porosity, and/or coverage over exposed metal surfaces without oxidizing the metal surfaces.

While this disclosure is not limited by any particular theory, it is believed that the plasma conditions in typical PECVD processes fragment the silicon-containing precursor molecules in a manner that produces undesirable effects. For example, PECVD may break Si—O and/or Si—C bonds in the precursor molecules to produce highly reactive radicals or other fragment types having high sticking coefficients. The fragments of the resulting doped silicon carbide film can include silicon, carbon, and/or oxygen atoms with bonds that are "dangling," meaning that silicon, carbon, and/or oxygen atoms have reactive unpaired valence electrons. High sticking coefficients of the precursor molecules and their fragments can deposit silicon carbide films with poor step coverage, as reactive precursor fragments may disproportionately stick to the upper regions of sidewalls and other structures in recessed features.

The dangling bonds can produce silanol groups (Si—OH) in a deposited silicon oxycarbide or silicon oxynitricarbide film. As a result, the film may have detrimentally high dielectric constants. Film quality may also suffer because the direct plasma conditions tend to extract carbon out of the deposited film.

Furthermore, the dangling bonds can produce increased silicon-hydrogen bonding (Si—H) in deposited silicon carbide films. Broken bonds of Si—C can be replaced with Si—H in direct plasma deposition conditions. The presence of Si—H bonds in silicon carbide films can produce films with poor electrical properties. For example, the presence of Si—H bonds can reduce breakdown voltages and can increase leakage currents because the Si—H bonds provide a leakage path for electrons.

Further, the dangling bonds can lead to uncontrolled chemical or morphological structures in the silicon carbide films. In some cases, such structures are dense filaments having low or no porosity, such that the fill has an unacceptably high dielectric constant. The lack of porosity can be the result of the direct plasma conditions breaking Si—C and/or Si—O bonds in cyclic siloxanes that would otherwise provide porosity in an ultralow-k dielectric material.

Direct plasma conditions sometimes employed in PECVD can lead to directionality in the deposition because the energy to break up the precursor molecules can be a low frequency which creates a lot of ion bombardment at the surface. The directional deposition can also lead to deposition of silicon carbide films with poor step coverage. A direct plasma is a plasma in which the plasma (electrons and positive ions at an appropriate concentration) reside in close proximity to the substrate surface during deposition, sometimes separated from the substrate surface by only a plasma sheath.

Typical PECVD processes are sometimes inappropriate for depositing silicon carbide films over exposed copper or other metal surfaces because such processes can oxidize metal. The PECVD process may use oxidants such as oxygen ($O_2$), ozone ($O_3$), carbon dioxide ($CO_2$), or other oxidizing species to form a silicon oxycarbide film.

Environment at the Substrate Surface During Deposition

FIG. 1A illustrates a cross-section of an example silicon carbide film deposited over a substrate. The silicon carbide film 101 can be formed under process conditions producing a relatively mild environment adjacent to the substrate 100. The substrate 100 can be any wafer, semiconductor wafer, partially fabricated integrated circuit, printed circuit board, display screen, or other appropriate work piece. The process for depositing the silicon carbide film 101 can involve one or more silicon-containing precursors having one or more Si—H bonds and/or one or more Si—Si bond, along with other bonds such as Si—C bonds, Si—O bonds, and/or Si—N bonds, depending on the type of doped structure to be produced.

Figure 1B:
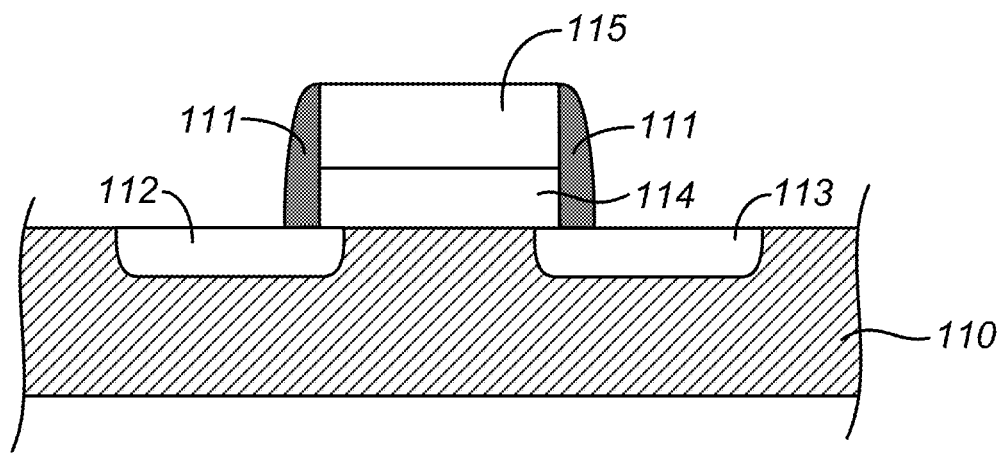
FIG. 1B illustrates silicon carbide vertical structures on the sidewalls of a gate electrode structure of a transistor.
Figure 1C:
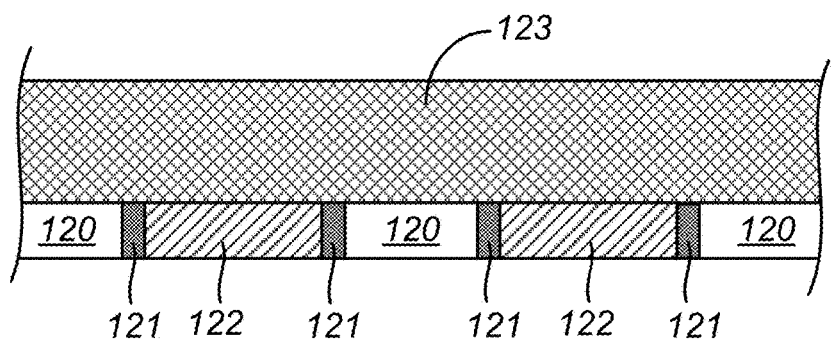
FIG. 1C illustrates silicon carbide vertical structures on exposed sidewalls of copper lines in an air gap type metallization layer.
Figure 1D:
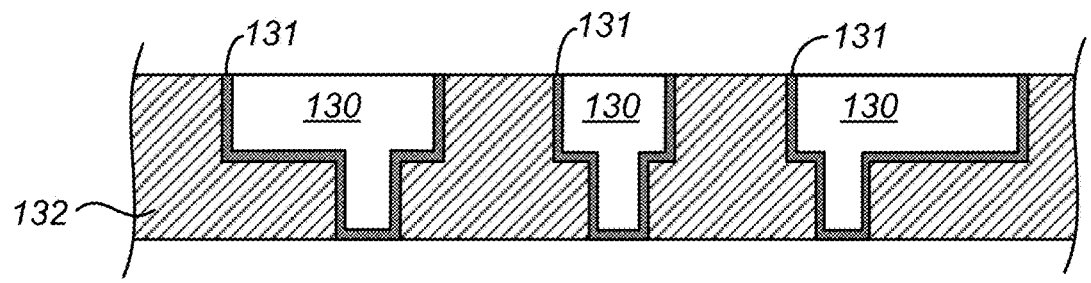
FIG. 1D illustrates silicon carbide pore sealants for porous dielectric materials.

Certain applications employing oxygen doped silicon carbide films are depicted in FIGS. 1B-1D. In some embodiments, the silicon-containing precursors can include silicon-oxygen containing precursors, silicon-nitrogen containing precursors, and/or silicon-carbon containing precursors. The silicon-oxygen containing precursors can include one or more Si—O bonds, the silicon-nitrogen containing precursors can include one or more Si—N bonds, and the silicon-carbon containing precursors can include one or more Si—C bonds. In some embodiments, for example, the silicon-containing precursors can include a single reactant A with Si—O and Si—C bonds. In some embodiments, the silicon-containing precursors can include a reactant B with Si—O bonds and a reactant C with Si—C bonds. It will be understood that any number of suitable reactants may be employed in the scope of this present disclosure. The chemical structures of example silicon-containing precursors are discussed in further detail below.

The silicon-containing precursors include one or more Si—H bonds and/or one or more Si—Si bonds. During the deposition process, the Si—H bonds and/or Si—Si bonds are broken and serve as reactive sites for forming bonds between the silicon-containing precursors in the deposited silicon carbide film 101. The broken bonds can also serve as sites for cross-linking during thermal processing conducted during or after deposition. Bonding at the reactive sites and cross-linking can form a primary backbone or matrix collectively in the resulting silicon carbide film 101.

In some embodiments, the process conditions can substantially preserve Si—C bonds and, if present, Si—O and Si—N bonds in the as-deposited layer of the silicon carbide film 101. Accordingly, the reaction conditions adjacent to the substrate 100 provide for the selective breaking of Si—H and/or Si—Si bonds, e.g., extracting hydrogen from the broken Si—H bonds, but the reaction conditions do not provide for extracting oxygen from Si—O bonds, nitrogen from Si—N bonds, or carbon from Si—C bonds. However, as discussed below, introduction of a co-reactant such as oxygen may extract carbon from Si—C bonds. Generally, the described reaction conditions exist at the exposed face of the substrate 100 (the face where the silicon carbide film 101 is deposited). They may further exist at some distance above the substrate 100, e.g., about 0.5 micrometers to about 150 millimeters above the substrate 100. In effect, activation of the precursor can happen in the gas phase at a substantial distance above the substrate 100. Typically, the pertinent reaction conditions will be uniform or substantially uniform over the entire exposed face of the substrate 100, although certain applications may permit some variation.

In addition to silicon-containing precursors, the environment adjacent the work piece (e.g., substrate 100) can include one or more radical species, preferably in a substantially low energy state. An example of such species includes hydrogen atom radicals. In some embodiments, all, or substantially all, or a substantial fraction of the hydrogen atom radicals can be in the ground state, e.g., at least about 90% or 95% of the hydrogen atom radicals adjacent the work piece are in the ground state. In certain embodiments, source gas is provided in a carrier gas such as helium. As an example, hydrogen gas may be provided in a helium carrier at a concentration of about 1-10% hydrogen. Pressure, fraction of carrier gas such as helium, and other process conditions are chosen so that the hydrogen atoms encounter the substrate 100 as radicals in a low energy state without recombining.

As explained elsewhere, hydrogen gas may be supplied into a remote plasma source to generate hydrogen atom radicals or hydrogen radicals. Once generated, the hydrogen atom radicals may be in an excited energy state. For example, hydrogen in an excited energy state can have an energy of at least 10.2 eV (first excited state). Excited hydrogen atom radicals may cause unselective decomposition of a silicon-containing precursor. For example, hydrogen atom radicals in an excited state can easily break Si—H, Si—Si, Si—N, Si—O, and Si—C bonds, which can alter the composition or physical or electrical characteristics of the silicon carbide film 101. In some implementations, when the excited hydrogen atom radicals lose their energy, or relax, the excited hydrogen atom radical may become a substantially low energy state hydrogen atom radical or a ground state hydrogen atom radical. Hydrogen atom radicals in a substantially low energy state or ground state can be capable of selectively breaking Si—H and Si—Si bonds while generally preserving Si—O, Si—N, and Si—C bonds. In some implementations, process conditions may be provided so that excited hydrogen atom radicals lose energy or relax to form substantially low energy state or ground state hydrogen atom radicals. For example, the remote plasma source or associated components may be designed so that a residence time of hydrogen atom radicals diffusing from the remote plasma source to the substrate 100 is greater than the energetic relaxation time of an excited hydrogen atom radical. The energetic relaxation time for an excited hydrogen atom radical can be about equal to or less than about $1 \times 10^{-3}$ seconds.

A state in which a substantial fraction of hydrogen atom radicals are in the ground state can be achieved by various techniques. Some apparatus, such as described below, are designed to achieve this state. Apparatus features and process control features can be tested and tuned to produce a mild state in which a substantial fraction of the hydrogen atom radicals are in the ground state. For example, an apparatus may be operated and tested for charged particles downstream of the plasma source; i.e., near the substrate 100. The process and apparatus may be tuned until substantially no charged species exist near the substrate 100. Additionally, apparatus and process features may be tuned to a configuration where they begin to produce a silicon carbide film 101 from a standard precursor such as trimethylsilane. The relatively mild conditions that support such film deposition are chosen.

Other examples of radical species include oxygen-containing species such as elemental oxygen radicals (atomic or biatomic), nitrogen-containing species such as elemental nitrogen radicals (atomic or biatomic), and N—H containing radicals such as ammonia radicals, where nitrogen is optionally incorporated into the film. Examples of N—H containing radicals include but are not limited to radicals of methylamine, dimethylamine, and aniline. The aforementioned radical species may be produced from a source gas that includes hydrogen, nitrogen, N—H containing species, or mixtures thereof. In some embodiments, substantially all or a substantial fraction of atoms of the deposited film are provided by the precursor molecules. In such cases, the low energy radicals used to drive the deposition reaction may be exclusively hydrogen or other species that does not substantially contribute to the mass of the deposited layer. In some embodiments, as discussed in further detail below, the radical species can be produced by a remote plasma source. In some embodiments, radicals of higher energy state or even ions can potentially be present near the wafer plane.

In some embodiments, the process conditions employ radical species in a substantially low energy state sufficient to break Si—H bonds and/or Si—Si bonds while substantially preserving Si—O, Si—N, and Si—C bonds. Such process conditions may not have substantial amounts of ions, electrons, or radical species in high energy states such as states above the ground state. In some embodiments, the concentration of ions in the region adjacent the film is no greater than about $10^7/cm^3$. The presence of substantial amounts of ions or high energy radicals may tend to break Si—O, Si—N, and Si—C bonds, which can produce films with undesirable electrical properties (e.g., high dielectric constants and/or low breakdown voltages) and poor conformality. It is believed that an excessively reactive environment produces reactive precursor fragments that have high sticking coefficients (representing a propensity to chemically or physically stick to work piece sidewalls), resulting in poor conformality.

The silicon-containing precursors are typically delivered with other species, notably carrier gas, in the environment adjacent to the substrate 100. In some implementations, the silicon-containing precursors are present with the radical species and other species, including other reactive species and/or carrier gases. In some embodiments, the silicon-containing precursors may be introduced as a mixture. Upstream from the deposition reaction surface, the silicon-containing precursors can be mixed with an inert carrier gas. Example inert carrier gases include, but are not limited to, nitrogen ($N_2$), argon (Ar), and helium (He). In addition, the silicon-containing precursors can be introduced in a mixture having major and minor species, with the minor species containing some element or structural feature (e.g., a ring structure, a cage structure, an unsaturated bond, etc.) that is present in the silicon carbide film 101 at a relatively low concentration. The multiple precursors may be present in equimolar or relatively similar proportions as appropriate to form the primary backbone or matrix in the resulting silicon carbide film 101. In other embodiments, the relative amounts of the different precursors are substantially skewed from equimolarity.

In some embodiments, one or more silicon-containing precursors provide essentially all of the mass of the deposited silicon carbide film 101, with small amounts of hydrogen or other element from a remote plasma providing less than about 5% atomic or less than about 2% atomic of the film mass. In some embodiments, only the radical species and one or more silicon-containing precursors contribute to the composition of the deposited silicon carbide film 101. In other embodiments, the deposition reaction includes a co-reactant other than one or more silicon-containing precursors and the radical species. Examples of such co-reactants include carbon dioxide ($CO_2$), carbon monoxide (CO), water ($H_2O$), methanol ($CH_3OH$), oxygen ($O_2$), ozone ($O_3$), nitrogen ($N_2$), nitrous oxide ($N_2O$), ammonia ($NH_3$), diazene ($N_2H_2$), methane ($CH_4$), ethane ($C_2H_6$), acetylene ($C_2H_2$), ethylene ($C_2H_4$), diborane ($B_2H_6$), and combinations thereof. Such materials may be used as nitriding agents, oxidizers, reductants, etc. In some cases, they can be used to tune the amount of carbon in the deposited film by removing a fraction of the carbon provided with the silicon-containing precursor. In some implementations employing a non-hydrogen co-reactant, the co-reactant is introduced to the reaction chamber via the same flow path as the silicon-containing precursor; e.g., a path including a showerhead, typically without direct exposure to plasma. In some embodiments, oxygen and/or carbon dioxide is introduced with the precursor to alter the composition of the silicon carbide film 101 by removing carbon from the film or precursor during deposition. In some implementations employing a non-hydrogen co-reactant, the co-reactant is introduced to the reaction chamber via the same flow path as the hydrogen, such that the co-reactant is at least partially converted to radicals and/or ions. In such implementations, the hydrogen radicals and the co-reactant radicals both react with the silicon-containing precursor(s) to produce the deposited silicon carbide film 101.

In certain embodiments where co-reactants are used and they are introduced to the chamber with the species being converted to radicals (e.g., hydrogen), they may be provided to the reaction chamber in relatively small amounts in comparison to the other gases in the reaction chamber, including the source of radicals (e.g., hydrogen) and any carrier gas(es) such as helium. For example, the co-reactant may be present in the process gases at about 0.05% or less by mass, or at about 0.01% or less by mass, or at about 0.001% or less by mass. For example, a reactant mixture (that goes into the plasma source) may be about 10-20 liters per minute (L/m) He, about 200-500 standard cubic centimeters per minute (sccm) H2, and about 1-10 sccm oxygen. When the co-reactants are introduced to the reaction chamber along with the silicon-containing precursor (e.g., through a showerhead), they may be present at a higher concentration; for example about 2% or less or about 0.1% or less. When the co-reactant is a relatively weak reactant (e.g., a weak oxidant such as carbon dioxide), it may be present at even higher concentrations, such as about 10% or less or about 4% or less.

The temperature in the environment adjacent to the substrate 100 can be any suitable temperature facilitating the deposition reaction, but sometimes limited by the application of the device containing the silicon carbide film 101. In some embodiments, the temperature in the environment adjacent to the substrate 100 can be largely controlled by the temperature of a pedestal on which a substrate 100 is supported during deposition of the silicon carbide film 101. In some embodiments, the operating temperature can be between about 50° C. and about 500° C. For example, the operating temperature can be between about 250° C. and about 400° C. in many integrated circuit applications. In some embodiments, increasing the temperature can lead to increased cross-linking on the substrate surface.

The pressure in the environment adjacent to the substrate 100 can be any suitable pressure to produce reactive radicals in a reaction chamber. In some embodiments, the pressure can be about 35 Torr or lower. For example, the pressure can be between about 10 Torr and about 20 Torr, such as in embodiments implementing a microwave generated plasma. In other examples, the pressure can be less than about 5 Torr, or between about 0.2 Torr and about 5 Torr, such as in embodiments implementing a radio-frequency (RF) generated plasma.

FIGS. 1B-1D illustrate cross-sections of structures containing silicon carbide films in a variety of applications. FIG. 1B illustrates silicon carbide vertical structures on the sidewalls of a gate electrode structure of a transistor. FIG. 1C illustrates silicon carbide vertical structures on exposed sidewalls of copper lines in an air gap type metallization layer. FIG. 1D illustrates silicon carbide pore sealants for porous dielectric materials. Each of these applications is discussed in further detail below.

Chemical Structure of Precursors

As discussed, the precursors employed in forming silicon carbide films can include silicon-containing precursors, with at least some of the silicon-containing precursors having at least one Si—H and/or at least one Si—Si bond. In certain embodiments, the silicon-containing precursor has at most one hydrogen atom on every silicon atom. Thus, for example, a precursor having one silicon atom has at most one hydrogen atom bonded to the silicon atom; a precursor having two silicon atoms has one hydrogen atom bonded to one silicon atom and optionally another hydrogen atom bonded to the second silicon atom; a precursor having three silicon atoms has at least one hydrogen atom bonded to one silicon atom and optionally one or two more hydrogen atoms bonded to one or two of the remaining silicon atoms, and so on. In addition, the silicon-containing precursors may include at least one Si—O bond, at least one Si—N bond, and/or at least one Si—C bond. While any number of appropriate precursors can be used in forming silicon carbide films, at least some of the precursors will include silicon-containing precursors with at least one Si—H bond or Si—Si bond, and optionally at least one Si—O bond, Si—N bond, and/or Si—C bond. In various implementations, the silicon-containing precursor(s) contain no O—C or N—C bonds; e.g., the precursor(s) contain no alkoxy (—O—R), where R is an organic group such as a hydrocarbon group, or amine (—$NR_1R_2$) groups, wherein $R_1$ and $R_2$ are independently hydrogen or organic groups.

In certain embodiments, at least some of the carbon provided for the silicon carbide film is provided by one or more hydrocarbon moieties on the silicon-containing precursor. Such moieties may be from alkyl groups, alkene groups, alkyne groups, aryl groups, and the like. In certain embodiments, the hydrocarbon group has a single carbon atom to minimize steric hindrance of the Si—H and/or Si—Si bond breaking reaction during deposition. However, the precursors are not limited to single-carbon groups;

higher numbers of carbon atoms may be used such as 2, 3, 4, 5, or 6 carbon atoms. In certain embodiments, the hydrocarbon group is linear. In certain embodiments, the hydrocarbon group is cyclic.

In some embodiments, the silicon-containing precursor falls into a chemical class. It will be understood that other chemical classes of silicon-containing precursors may be employed and that the silicon-containing precursors are not limited to the chemical classes discussed below.

In some embodiments, the silicon-containing precursor can be a siloxane. In some embodiments, the siloxane may be cyclic. Cyclic siloxanes may include cyclotetrasiloxanes, such as 2,4,6,8-tetramethylcyclotetrasiloxane (TMCTS), octamethylcyclotetrasiloxane (OMCTS), and heptamethylcyclotetrasiloxane (HMCTS). Other cyclic siloxanes can also include but are not limited to cyclotrisiloxanes and cyclopentasiloxanes. Embodiments using cyclic siloxanes are ring structures that can introduce porosity into an oxygen doped silicon carbide film, with the size of the pores corresponding to the radius of the ring. For example, a cyclotetrasiloxane ring can have a radius of about 6.7 Å.

Figure 2:
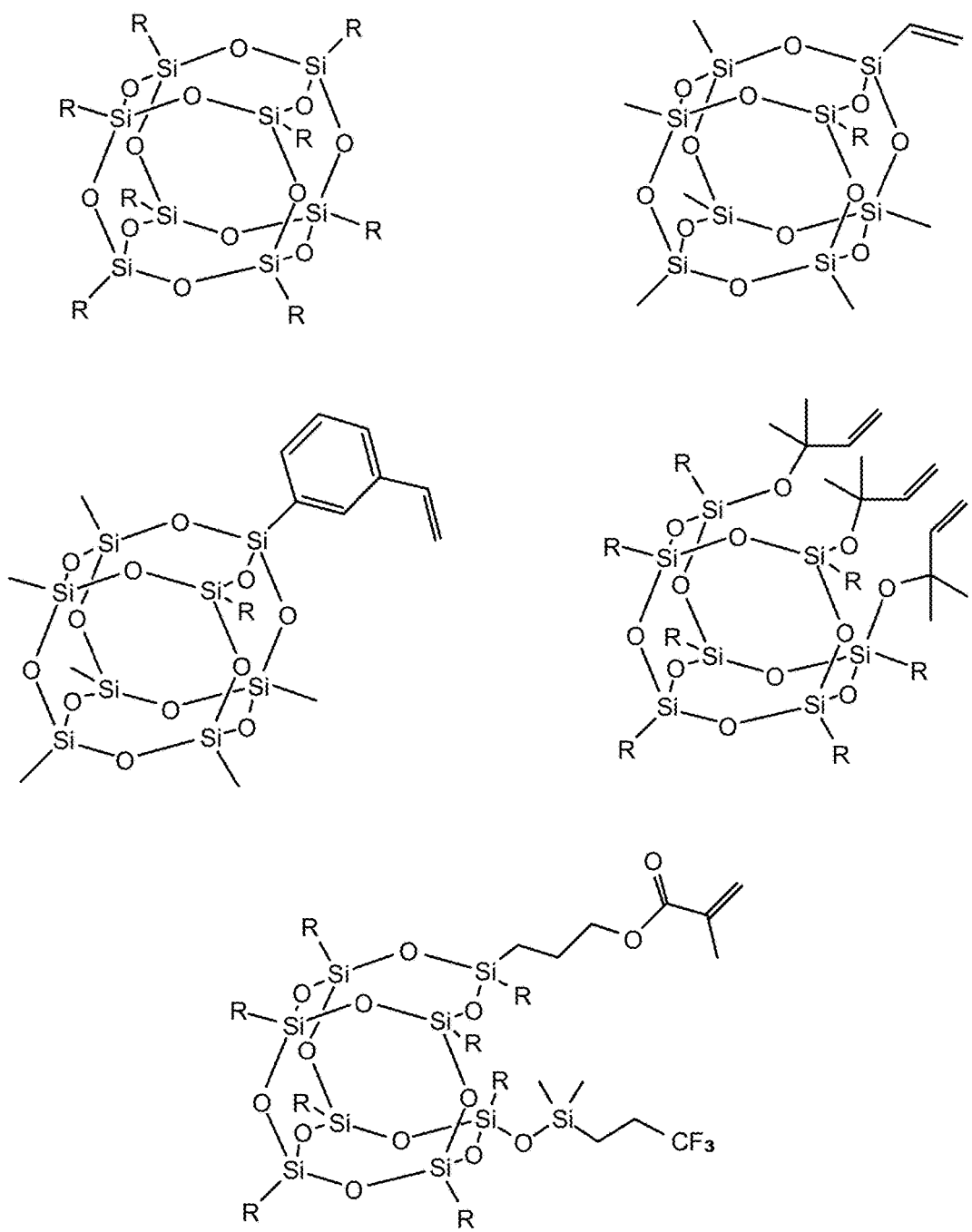
FIG. 2 illustrates examples of representative caged siloxane precursors.

In some embodiments, the siloxane may have a three-dimensional or caged structure. FIG. 2 illustrates examples of representative caged siloxane precursors. Caged siloxanes have silicon atoms bridged to one another via oxygen atoms to form a polyhedron or any 3-D structure. An example of a caged siloxane precursor molecule is silsesquioxane. Caged siloxane structures are described in further detail in commonly owned U.S. Pat. No. 6,576,345 to Cleemput et al., which is incorporated by reference herein in its entirety and for all purposes Like the cyclic siloxanes, the caged siloxane can introduce porosity into an oxygen doped silicon carbide film. In some embodiments, the porosity scale is mesoporous.

In some embodiments, the siloxane may be linear. Examples of suitable linear siloxanes include but are not limited to disiloxanes, such as pentamethyldisiloxane (PMDSO) and tetramethyldisiloxane (TMDSO), and trisiloxanes such as hexamethyltrisiloxane, heptamethyltrisiloxane.

In some embodiments, the silicon-containing precursor can be an alkyl silane or other hydrocarbon-substituted silane. The alkyl silanes include a central silicon atom with one or more alkyl groups bonded to it as well as one or more hydrogen atoms bonded to it. In certain embodiments, any one or more of the alkyl groups contain 1-5 carbon atoms. The hydrocarbon groups may be saturated or unsaturated (e.g., alkene (e.g., vinyl), alkyne, and aromatic groups). Examples include but are not limited to trimethylsilane (3MS), triethylsilane, pentamethyl disilamethane ($(CH_3)_2Si-CH_2-Si(CH_3)_3$), and dimethylsilane (2MS).

In some embodiments, the silicon-containing precursor can be an alkoxy silane. The alkoxy silanes include a central silicon atom with one or more alkoxy groups bonded it and one or more hydrogen atoms bonded to it. Examples include but are not limited to trimethoxysilane (TMOS), dimethoxysilane (DMOS), methoxysilane (MOS), methyldimethoxysilane (MDMOS), diethyoxymethylsilane (DEMS), dimethylethoxysilane (DMES), and dimethylmethoxysilane (DMMOS).

Additionally, disilanes, trisilanes, or other higher silanes may be used in place of monosilanes. An example of one such disilane from the alkyl silane class is hexamethyldisilane (HMDS). Another example of a disilane from the alkyl silane class can include pentamethyldisilane (PMDS). Other types of alkyl silanes can include alkylcarbosilanes, which can have a branched polymeric structure with a carbon bonded to a silicon atom as well as alkyl groups bonded to a silicon atom. Examples include dimethyl trimethylsilyl methane (DTMSM) and bis-dimethylsilyl ethane (BDMSE). In some embodiments, one of the silicon atoms can have a carbon-containing or hydrocarbon-containing group attached to it, and one of the silicon atoms can have a hydrogen atom attached to it.

In depositing silicon carbide, multiple silicon-containing precursors can be present in the process gas. For example, a siloxane and an alkyl silane may be used together, or a siloxane and an alkoxy silane may be used together. The relative proportions of the individual precursors can be chosen based on the chemical structures of precursors chosen and the application of the resulting silicon carbide film. For example, the amount of siloxane can be greater than the amount of silane in molar percentages to produce a porous film as discussed in more detail below.

For depositing oxygen doped silicon carbide films, examples of suitable precursors include cyclic siloxanes such as cyclotetrasiloxanes such as heptamethylcyclotetrasiloxane (HMCTS) and tetramethylcyclotetrasiloxane. Other cyclic siloxanes can also include but are not limited to cyclotrisiloxanes and cyclopentasiloxanes. For depositing oxygen doped silicon carbide films, other examples of suitable precursors include linear siloxanes such as, but not limited to, disiloxanes, such as pentamethyldisiloxane (PMDSO), tetramethyldisiloxane (TMDSO), hexamethyl trisiloxane, and heptamethyl trisiloxane.

As explained, silicon-containing precursors are chosen to provide highly conformal silicon carbide films. It is believed that silicon-containing precursors having low sticking coefficients are capable of producing highly conformal films. "Sticking coefficient" is a term used to describe the ratio of the number of adsorbate species (e.g., fragments or molecules) that adsorb/stick to a surface compared to the total number of species that impinge upon that surface during the same period of time. The symbol $S_c$ is sometimes used to refer to the sticking coefficient. The value of $S_c$ is between 0 (meaning that none of the species stick) and 1 (meaning that all of the impinging species stick). Various factors affect the sticking coefficient including the type of impinging species, surface temperature, surface coverage, structural details of the surface, and the kinetic energy of the impinging species. Certain species are inherently more "sticky" than others, making them more likely to adsorb onto a surface each time the specie impinges on the surface. These more sticky species have greater sticking coefficients (all other factors being equal), and are more likely to adsorb near the entrance of a recessed feature compared to less sticky species having lower sticking coefficients. In some cases, the sticking coefficient of the precursors (at the relevant deposition conditions) may be about 0.05 or less, for example about 0.001 or less.

Graded Silicon Carbide Film

Technology nodes are continually shrinking in the integrated circuit manufacturing industry. With each technology node, device geometries shrink and pitch becomes smaller. High aspect ratio gaps in such technology nodes may need to be filled with insulating material, such as insulating material with a low dielectric constant (low-k). Semiconductor integration operations may involve filling high aspect ratio gaps with low-k dielectric materials. This is the case for shallow trench isolation, inter-metal dielectric layers, passivation layers, and the like.

For example, going from a 45-nm technology node to a 14-nm technology node, device features shrink laterally so that conductive materials get closer and closer. Unwanted conductive coupling may occur as conductive materials get closer and closer, which can lead to parasitic capacitance, delay in signal propagation, and signal crosstalk due to capacitive effects. However, as technology nodes become smaller, low-k materials as the interlayer dielectric (ILD) of conductive interconnects can reduce parasitic capacitance, signal delay, and signal crosstalk. Some applications, including fin field effect transistor (finFET) structures and dynamic random-access memory (DRAM) bit structures, require low-k materials as sidewall spacer materials.

Silicon nitride ($Si_3N_4$) is often used as an insulating material in many integrated circuit applications because of its step coverage, thermal stability, etch-ability and etch resistance, and high breakdown voltages. However, the dielectric constant of silicon nitride, which is about 7-8, may be too high as technology nodes become smaller.

Silicon oxide ($SiO_2$) has a lower dielectric constant, which is about 4.0, and can provide a significant reduction in capacitance as an interlayer dielectric of conductive interconnects. However, silicon oxide may not have sufficient resistance or selectivity to etching operations in a device integration flow.

Silicon carbide materials, including doped silicon carbide materials, may serve as insulating materials in integrated circuit applications that provide not only a low dielectric constant, but also step coverage, thermal stability, wet etch resistance, dry etch selectivity to oxide/nitride, and high breakdown voltages. Incorporation of oxygen atoms and/or nitrogen atoms may tune the properties of silicon carbide materials. In some embodiments, an oxygen doped silicon carbide film can serve as an insulating material in integrated circuit applications that provides a low dielectric constant, wet etch resistance to survive device integration operations, and dry etch selectivity to oxide/nitride.

However, a single layer or film of oxygen doped silicon carbide may not possess all of the desired properties, including possessing both a low dielectric constant and a high etch resistance. In some embodiments, a multi-layer stack can be provided so that each layer has different properties, the multi-layer stack serving as an insulating material in integrated circuit applications. For example, an oxygen doped silicon carbide film can have varying amounts of carbon content in a multi-layer stack. The multi-layer stack can provide a top layer with wet etch resistance, dry etch selectivity to oxide/nitride, and thermal stability to serve as a protective layer and a bottom layer with a low dielectric constant (e.g. k<4.0). The top layer may have a high carbon content to provide wet etch resistance, a high resistance to steam anneal, a high resistance to ash and strip, and a high dry etch selectivity to oxide/nitride, and a high thermal stability. The bottom layer may have a low carbon content to provide a low dielectric constant and good electrical properties, such as a high breakdown voltage and a low leakage current. Intermediate layers may be formed in between. Each layer may be formed by selecting a different precursor, where the precursor can be selected based on its relative concentration of silicon, carbon, and oxygen. A layer with high carbon content may employ a silicon-containing precursor with more Si—C bonds, and a layer with low carbon content may employ a silicon-containing precursor with less Si—C bonds. Alternatively, each layer may be formed by changing a flow rate of a co-reactant gas relative to a flow rate of the silicon-containing precursor. Or, each layer may be formed by changing a flow rate of the silicon-containing precursor. Thus, layer composition tuning can be done by either appropriate precursor selection or co-reactant to precursor gas flow rate ratio selection.

Instead of multiple discrete layers, a silicon carbide film can be graded from a first surface to a second surface opposite the first surface. In some embodiments, the first and second surface may represent the bottom and top surface, respectively. In some embodiments, the first and second surface may represent the top and bottom surface, respectively. In some embodiments where the silicon carbide film is a sidewall spacer, the first surface may face conductive interconnects and the second surface may be exposed to subsequent device integration operations. A graded silicon carbide film can have a composition gradient from the first surface to the second surface. The composition gradient can be provided across a thickness of the graded silicon carbide film. Accordingly, properties of the graded silicon carbide film can gradually change across the thickness of the film.

Multiple discrete layers with varying composition and properties may not be as robust as a graded film, and may have more interface issues in a heterogeneous multi-layer stack. Multiple discrete layers may require carefully targeting a thickness of a protection layer to avoid the likelihood of failure. In other words, if a layer of silicon carbide with a high carbon concentration serves as a protection layer over a layer of silicon carbide with a low carbon concentration, then the thickness of the protection layer is carefully selected to survive the device integration operations or else the layer of silicon carbide with a low carbon concentration may not survive. A graded silicon carbide film, however, may offer more of a buffered zone for greater protection than a multi-layered silicon carbide film. Nevertheless, multiple discrete layers in a multi-layered silicon carbide film may not compromise as much in terms of electrical properties (e.g., low dielectric constant) because more of the multi-layered silicon carbide film can have a low carbon concentration.

Figure 4:
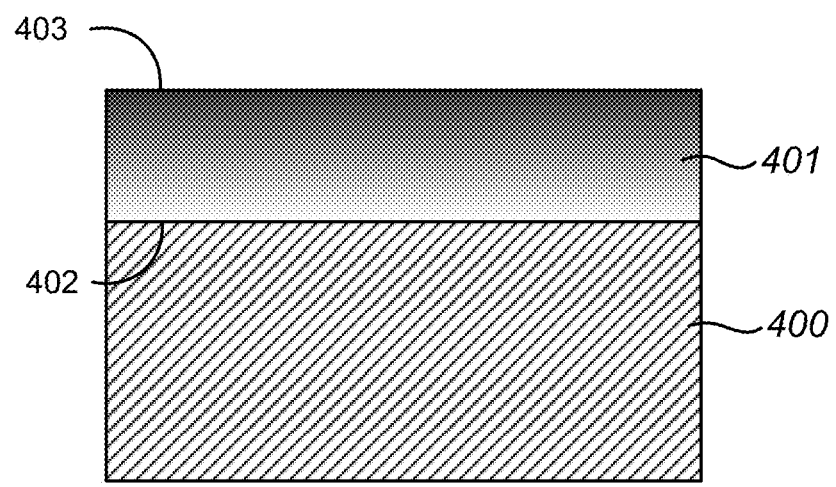
FIG. 4 illustrates a cross-section of an example graded silicon carbide film deposited over a substrate.

FIG. 4 illustrates a cross-section of an example graded silicon carbide film deposited over a substrate. It will be understood that various aspects of the graded silicon carbide film 401 may not only apply to graded structures with a composition gradient, but such aspects may also apply to multi-layered structures.

The graded silicon carbide film 401 can be deposited on the substrate 400 using a remote plasma based deposition process described in the present disclosure. The substrate 400 can be any wafer, semiconductor wafer, partially fabricated integrated circuit, printed circuit board, display screen, or other appropriate work piece. The graded silicon carbide film 401 has a first surface 402 facing towards the substrate and a second surface 403 opposite the first surface 402. The graded silicon carbide film 401 of the present disclosure can be implemented in a variety of applications, including in structures shown in FIGS. 1B-1D, which is discussed in further detail below.

The graded silicon carbide film 401 includes silicon and carbon and, if applicable, oxygen and/or nitrogen. In some embodiments, the atomic concentration of silicon is between about 15% and 45% (or about 25% to 40%), the atomic concentration of carbon is between about 5% and 50%, the atomic concentration of oxygen is between about 0% and 45%, and the atomic concentration of nitrogen is between about 0% and 45%. In one example, the film 401 contains about 10-40% carbon and about 20-40% oxygen, both on an atomic basis. In all cases, the film 401 contains some hydrogen. It will be understood that the relative atomic concentrations can vary depending on the choice of the precursor. The silicon atoms can form bonds with carbon and oxygen atoms. In certain embodiments, a film density is between about 2.0 and 2.7 $g/cm^3$.

It will be understood that the overall composition of the graded silicon carbide film 401 can vary depending on the choice of the precursor, the flow of the precursor, and the flow of co-reactant gas. In some embodiments, the internal structure of the precursor is maintained in the deposited film. This structure may preserve all or most of the Si—C, and Si—O and/or Si—N bonds, if present, in the precursor, while linking or cross-linking individual precursor moieties through bonds at locations where Si—H bonds and/or Si—Si bonds existed in the precursor molecules and/or through additional condensation reactions on the growing surface if sufficient thermal energy is provided.

The process conditions described earlier herein can provide a film structure that is highly conformal, regardless of whether the silicon carbide film is graded or ungraded. The relatively mild process conditions can minimize the degree of ion bombardment at the surface of the substrate so that the deposition is isotropic. Moreover, the relatively mild process conditions can reduce the number of radicals with high sticking coefficients that would have a tendency to stick to the sidewalls of previously deposited layers or films. In certain embodiments, for depth-to-width aspect ratios of about 2:1 to 10:1, the graded silicon carbide film may be deposited with a conformality of between about 25% and 100%, more typically between about 50% and 100%, and even more typically between about 80% and 100%. Conformality may be calculated by comparing the average thickness of a deposited film on a bottom, sidewall, or top of a feature to the average thickness of a deposited film on a bottom, sidewall, or top of a feature. For example, conformality may be calculated by dividing the average thickness of the deposited film on the sidewall by the average thickness of the deposited film at the top of the feature and multiplying it by 100 to obtain a percentage. For certain applications, a conformality of between about 85% and 95% is sufficient. In some examples, depositing graded silicon carbide on features having an aspect ratio of between about 2:1 and about 4:1, the conformality is at least about 90%. Certain BEOL (back end of line) processes fall into this category. In some examples, depositing graded silicon carbide on features having an aspect ratio of between about 4:1 and about 6:1, the conformality is at least about 80%. Certain spacer deposition processes fall into this category. In some examples, depositing graded silicon carbide on features having an aspect ratio of between about 7:1 and about 10:1 (and even higher), the conformality is at least about 90%. Certain DRAM fabrication processes fall into this category.

The process conditions can also provide a film structure with a high breakdown voltage and a low leakage current. By introducing a limited amount of oxygen or nitrogen into a silicon carbide class of material, leakage paths provided by Si—H bonds and/or Si—CH$_2$—Si bonds may be blocked by oxygen or nitrogen. The mode of conduction may be different in Si—O and Si—N at low fields. This can provide improved electrical properties while maintaining a relatively low dielectric constant. In various embodiments, the film has an effective dielectric constant of about 6.0 or lower, or about 5.0 or lower, or about 4.0 or lower, and in some cases about 3.5 or lower, and some cases about 3.0 or lower, and in still other implementations about 2.5 or lower. For film structures with an effective dielectric constant of 3.5 or lower, an appropriate flow rate of co-reactant gas and an appropriate silicon-containing precursor can be selected. The effective dielectric constant can depend on the bonding and density. In certain embodiments, oxygen doped silicon carbide films are made with a dielectric constant of 5.0 or greater, particularly when the carbon content is relatively high. If leakage current is an important consideration, oxygen doped silicon carbide films need to be less than about 5.0. The lower the dielectric constant, the worse will be its hermetic and barrier and thermal resistance properties.

In some implementations, the graded silicon carbide film includes oxygen doped silicon carbide, where oxygen doped silicon carbide may generally refer to SiOC or SiCO. As used herein, however, SiOC is not the same as SiCO because an SiOC film does not have the same chemical structure or properties as an SiCO film. An SiCO film can represent the chemical structure deposited by the remote plasma based deposition process of the present disclosure. An SiCO film includes little to no terminal CH$_3$ bonds, where carbon atoms are generally cross-linked and coordinated by silicon atoms. The carbon atoms, or at least a substantial fraction of the carbon atoms, are cross-linked and not coordinated by hydrogen or oxygen atoms. In addition, an SiCO film has a relatively low hydrogen content. In contrast, an SiOC film includes multiple terminal CH$_3$ bonds, where carbon atoms are coordinated by oxygen and hydrogen atoms. The carbon atoms, or at least a substantial fraction of the carbon atoms, are not cross-linked. In addition, an SiOC film has a relatively high hydrogen content. SiOC films are generally not as thermally stable and chemically stable as SiCO films. In some embodiments, it will be understood that the graded silicon carbide film of the present disclosure is a graded SiCO film.

Though many embodiments below refer to graded SiCO films, it will be understood that a graded silicon carbide film of the present disclosure also can apply to silicon oxynitricarbide (SiONC) films and silicon nitricarbide (SiNC) films. Silicon carbide films can thus refer to SiC, SiCO, SiONC, and SiNC films. In some implementations, graded SiONC films or graded SiNC films can be deposited using different precursors and/or different co-reactant gas than SiCO films. In some implementations, the co-reactant gas can include, for example, N$_2$, N$_2$O, NH$_3$, N$_2$H$_2$, or combinations thereof.

A graded silicon carbide film can be deposited using remote plasma based deposition techniques described in the present disclosure. The graded silicon carbide film can be deposited in situ or without a vacuum break (e.g., air break). A vacuum break can introduce oxidation into the semiconductor device, which can lead to higher electrical resistance and decreased performance. Furthermore, the vacuum break can reduce throughput. The graded silicon carbide film also reduces interface weaknesses that can result from multiple deposition processes for multiple discrete layers.

The process for depositing the graded silicon carbide film can involve one or more silicon-containing precursors having one or more Si—H bonds and/or one or more Si—Si bond, along with other bonds such as Si—C bonds, Si—O bonds, and/or Si—N bonds, depending on the type of doped structure to be produced. The one or more silicon-containing precursors can include any silicon-containing precursor as discussed above. In some implementations, the one or more silicon-containing precursors include an organosilicon precursor. The organosilicon precursor can be flowed into a reaction chamber and onto a substrate provided in the reaction chamber. In depositing a graded SiNC film, the organosilicon precursor can include: (i) one or more Si—H bonds and/or Si—Si bonds, (ii) one or more Si—C bonds, and (iii) one or more Si—N bonds. In depositing a graded SiCO film, the organosilicon precursor can include: (i) one or more Si—H bonds and/or Si—Si bonds, (ii) one or more Si—C bonds, and (iii) one or more Si—O bonds. For example, the organosilicon precursor can be selected from a group consisting of: a cyclic siloxane, a linear siloxane, and an alkoxy silane.

In addition to one or more silicon-containing precursors, the process for depositing the graded silicon carbide film can involve one or more radical species, preferably in a substantially low energy state (e.g., ground state). The one or more radical species in a substantially low energy state may be provided as described above. A source gas, such as hydrogen gas, may be supplied into a remote plasma source. The remote plasma source may generate radicals of the source gas and introduce the radicals of the source gas onto the substrate. In some embodiments, the one or more radical species include one or more hydrogen atom radicals. The hydrogen atom radicals may be introduced onto the substrate in a substantially low energy state, as the hydrogen atom radicals may transition from an excited state to a relaxed state. Hydrogen atom radicals in a substantially low energy state or ground state can be capable of selectively breaking Si—H and Si—Si bonds while generally preserving Si—O, Si—N, and Si—C bonds. In some embodiments, at least 90% of the radical species of the source gas are hydrogen atom radicals in the ground state. A state in which a substantial fraction of hydrogen atom radicals are in the substantially low energy state or ground state can be achieved by various techniques. Some apparatus, such as described below, are designed to achieve this state.

In addition or in the alternative, the one or more radical species can include oxygen-containing species such as elemental oxygen radicals (atomic or biatomic), nitrogen-containing species such as elemental nitrogen radicals (atomic or biatomic), and N—H containing radicals such as ammonia radicals, where nitrogen is optionally incorporated into the film.

The process conditions for depositing the graded silicon carbide film may not have substantial amounts of ions, electrons, or radical species in high energy states such as states above the ground state. In some embodiments, the concentration of ions in the region adjacent the film is no greater than about $10^7/cm^3$. Other process conditions, such as pressure and temperature, as described above may similarly apply for depositing the graded silicon carbide film.

In certain embodiments, the source gas is provided in a carrier gas such as helium. As an example, hydrogen gas may be provided in a helium carrier at a concentration of about 1-10% hydrogen. Pressure, fraction of carrier gas such as helium, and other process conditions are chosen so that the hydrogen atoms encounter the substrate as radicals in a low energy state without recombining.

The process for depositing the graded silicon carbide film can involve a co-reactant other than the one or more silicon-containing precursors and the one or more radical species of the source gas. Example co-reactants can include $O_2$, $CO_2$, CO, $H_2O$, $CH_3OH$, $O_3$, $N_2$, $N_2O$, $NH_3$, $N_2H_2$, $CH_4$, $C_2H_6$, $C_2H_2$, $C_2H_4$, $B_2H_6$, and combinations thereof. In some implementations in depositing a graded SiCO film, the co-reactant can include $O_2$, $CO_2$, CO, $O_3$, $N_2O$, and combinations thereof. In some implementations in depositing a graded SiNC film, the co-reactant can include $N_2$, $NH_3$, $N_2H_2$, and combinations thereof.

A co-reactant can be flowed towards the reaction chamber, where the flow path of the co-reactant can be with the silicon-containing precursor or with the source gas. In some implementations employing a non-hydrogen co-reactant, the co-reactant is introduced to the reaction chamber via the same flow path as the silicon-containing precursor; e.g., a path including a showerhead, typically without direct exposure to plasma. In some implementations employing a non-hydrogen co-reactant, the co-reactant is introduced to the reaction chamber via the same flow path as the source gas (e.g., hydrogen), where the co-reactant can be flowed through the plasma source and towards the reaction chamber, such that the co-reactant is at least partially converted to radicals and/or ions. Thus, one or more radicals of the co-reactant can be generated in the remote plasma source, and the one or more radicals of the co-reactant can be introduced into the reaction chamber. When co-reactants are introduced to the reaction chamber, they may be provided in relatively small amounts in comparison to some of the other gases provided in the reaction chamber. In some embodiments, a flow rate of a co-reactant gas can be less than about 10 sccm, while a flow rate of a carrier gas and a flow rate of a source gas is each equal to or greater than about 10 L/m.

A flow rate of a co-reactant gas can change over time in forming a multi-layered silicon carbide film or a graded silicon carbide film. In some embodiments, the flow-rate of the co-reactant gas can gradually change over time to form a composition gradient of a graded silicon carbide film. In some embodiments, the flow rate of the co-reactant gas can change in discrete time intervals or incrementally over time to form a multi-layered silicon carbide film. In some embodiments, the co-reactant gas is oxygen gas. In some embodiments, a flow rate of an organosilicon precursor can be constant while the flow rate of the co-reactant gas changes.

In some embodiments, a flow rate of an organosilicon precursor can change while the flow rate of the co-reactant gas changes. In some embodiments, a flow rate of an organosilicon precursor can change while the flow rate of the co-reactant gas is constant. Similar to changing a flow rate of the co-reactant gas over time, changing the flow rate of the organosilicon precursor over time can form a composition gradient of a graded silicon carbide film. The flow rate of the organosilicon precursor can change gradually over time, or change in discrete time intervals or incrementally over time. By changing the flow rate of the organosilicon precursor over time, a number of Si—C bonds can be adjusted to tune the carbon content in the first surface and the second surface.

Moreover, the organosilicon precursor can be selected to tune the carbon content in the graded silicon carbide film. Different organosilicon precursors with different carbon content can be utilized when depositing at different time intervals when depositing the graded silicon carbide film. For example, a first organosilicon precursor with more carbon bonds can be selected for deposition at a first surface and a second organosilicon precursor with less carbon bonds can be selected for deposition at a second surface. A change in the organosilicon precursor when depositing the graded silicon carbide film can result in steeper changes in the composition gradient of the graded silicon carbide film.

When the flow rate of the co-reactant gas changes over time, the flow rate of the co-reactant gas changes without a vacuum break. In changing the flow rate of the co-reactant gas to form a composition gradient of a graded silicon carbide film, a film with a more graduated continuum in composition is provided that can be more robust than a film with multiple discrete layers.

Therefore, the composition gradient of the graded silicon carbide film can be tuned by one or more techniques, including changing the organosilicon precursor, changing the flow rate of the organosilicon precursor over time, and changing the flow rate of the co-reactant gas over time.

Figure 5:
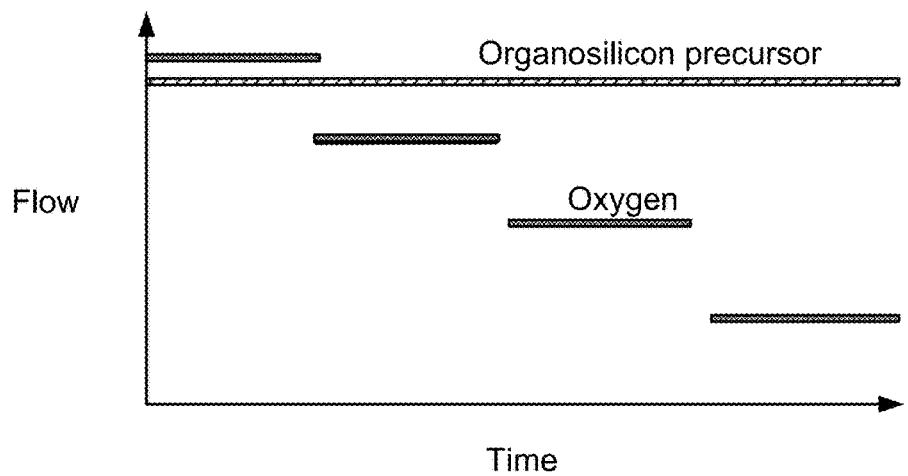
FIG. 5 shows a graph illustrating flow rates of an organosilicon precursor and a co-reactant gas of oxygen over time.

FIG. 5 shows a graph illustrating flow rates of an organosilicon precursor and a co-reactant gas of oxygen over time. As shown in FIG. 5, a flow rate of the organosilicon precursor can remain constant over time during deposition of a graded silicon carbide film. The graded silicon carbide film can be a graded SiCO film. Though not shown, a flow rate of a source gas of hydrogen and a carrier gas of helium can remain constant over time during deposition of the graded silicon carbide film. However, a flow rate of the co-reactant gas of oxygen incrementally changes over time. In FIG. 5, the flow rate of oxygen decreases over time. By way of an example, a flow rate of oxygen can start at 9.5 sccm for the first 50 Å of deposited film, then drop to 7.5 sccm for the next 50 Å of deposited film, then drop to 5.5 sccm for the next 50 Å of deposited film, and then drop to 3.5 sccm for the next 50 Å of deposited film. Each deposition of 50 Å of deposited film can be between about 100 seconds and about 500 seconds, such as about 375 seconds. The flow rate of the organosilicon precursor can be maintained at a constant flow rate of about 8.0 sccm. However, it will be understood that the flow rate of the organosilicon precursor can be different depending on the precursor chemistry. While the graph in FIG. 5 shows the change in flow rate as a stepped profile, it will be understood that the change in the flow rate can be a different profile, such as a sloped or curved profile.

By adjusting the flow rate of the co-reactant over time, the composition of the graded silicon carbide film varies across the thickness of the graded silicon carbide film. The presence of oxygen gas or oxygen radicals tends to extract carbon from Si—C bonds. In other words, the presence of oxygen can convert a carbide to an oxide. Carbon is removed from an organosilicon precursor on the substrate and, in some instances, can be replaced with oxygen. Therefore, increasing a concentration of oxygen in a reaction mixture can effectively tune the carbon content of the film, such as a graded SiCO film.

Alternatively, the presence of nitrogen gas or nitrogen radicals tends to extract carbon from Si—C bonds. Therefore, increasing a concentration of nitrogen in a reaction mixture also can effectively tune the carbon content of a graded silicon carbide film, such as a graded SiNC film.

In some embodiments, a composition gradient of the graded silicon carbide film has an increasing concentration of carbon from the first surface to the second surface of the silicon carbide film, or vice versa. The first surface has a lower concentration of carbon, where the atomic concentration of carbon can be less than about 20%, less than about 15%, or less than about 10%. The second surface has a higher concentration of carbon, where the atomic concentration of carbon can be greater than about 20%, greater than about 30%, or greater than about 35%. In some embodiments, the carbon concentration can range anywhere between about 1% and about 50% across the composition gradient, or anywhere between about 5% and about 45% across the composition gradient. In some implementations of an SiCO film, the first surface can have a carbon concentration that approaches the chemistry for $SiO_2$, and the second surface can have a carbon concentration that approaches the chemistry for SiC. With a decreasing concentration of oxygen over time in the reaction mixture, the film at the second surface can have more Si—C bonds and the film at the first surface can have fewer Si—C bonds. It will be understood that the carbon concentration gradient can be reversed depending on the application.

By way of an example, the composition gradient of a graded SiCO film has an increasing concentration of carbon from a bottom surface to a top surface, or vice versa. As used herein, a bottom surface of a graded SiCO film can refer to a surface deposited on a substrate or features of a substrate, and a top surface of a graded SiCO film can refer to a surface exposed to subsequent device integration operations. In some embodiments, the atomic concentration of carbon at the bottom surface is less than about 20%, such as about 12% and even as low as 5%, and the atomic concentration of carbon at the top surface is greater than about 20%, such as about 36% and even as high as 40%. With a higher concentration of carbon at the top surface, the top surface of the graded SiCO film has a higher dry etch selectivity to oxide/nitride, a higher resistance to ash and strip, and a higher resistance to harsh other integration steps such as a steam annealing process than the bottom surface. This allows the graded SiCO film to meet multiple device integration requirements. With a lower concentration of carbon at the bottom surface, the bottom surface of the graded SiCO film has a lower dielectric constant, a higher breakdown voltage, and a lower leakage current than the top surface. This allows the graded SiCO film to reduce parasitic capacitance, signal delay, and signal crosstalk especially in high speed devices.

In some embodiments, the surface with the lower carbon concentration can provide for a lower dielectric constant, where the dielectric constant can be less than about 5.0, or less than about 4.0, or less than about 3.5. A multi-layered silicon carbide film can provide, for example, a dielectric constant of about 3.5 at a first surface and a dielectric constant of about 4.5 at a second surface. A graded silicon carbide film can provide, for example, a dielectric constant of about 3.5 at a first surface that gradually increases to a dielectric constant of about 4.5 at a second surface, the graded silicon carbide film providing more buffer than the multi-layered silicon carbide film.

Figure 6:
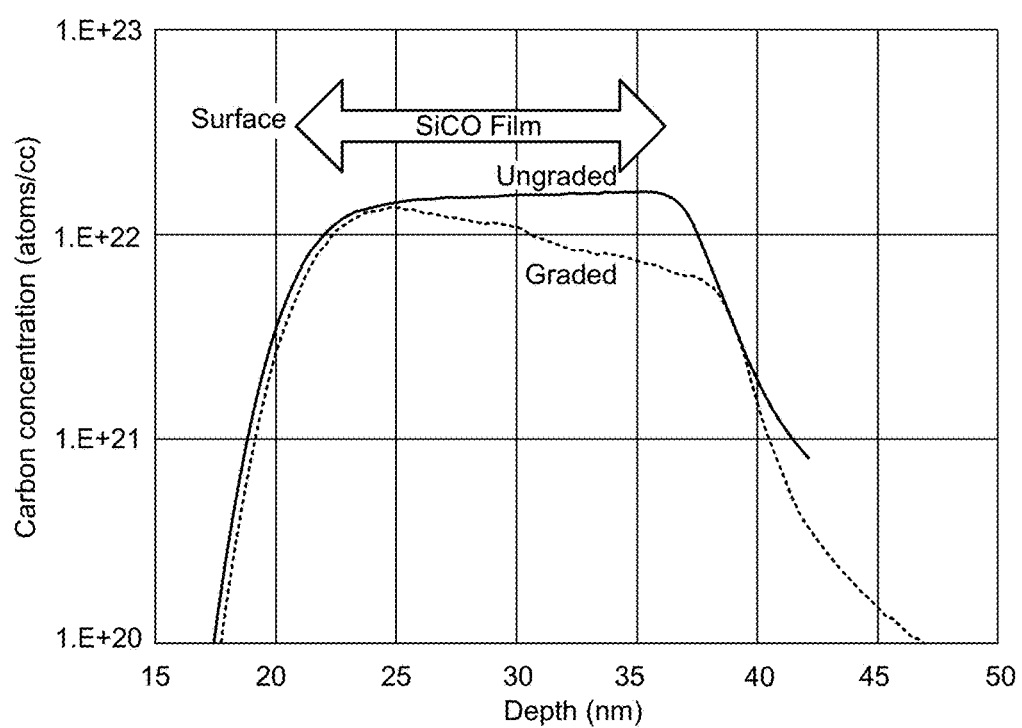
FIG. 6 shows a graph illustrating a composition profile of carbon concentration as a function of depth for a graded silicon carbide film and an ungraded silicon carbide film.

FIG. 6 shows a graph illustrating a composition profile of carbon concentration as a function of depth for a graded silicon carbide film and an ungraded silicon carbide film. In an ungraded SiCO film, the carbon concentration is generally constant across the thickness of the ungraded SiCO film. In a graded SiCO film, the carbon concentration slopes downward to indicate a decreasing concentration of carbon across the thickness of the graded SiCO film from an exposed surface (e.g., top surface) to an unexposed surface (e.g., bottom surface). As oxygen flow decreases over time as shown in FIG. 5, the carbon concentration may decrease across the thickness of the film from the exposed surface as shown in FIG. 6. Alternatively, as the organosilicon precursor flow decreases over time or if the organosilicon precursor changes to a lower carbon concentration, the carbon concentration can decrease across the thickness of the film from the exposed surface as shown in FIG. 6.

Figure 7:
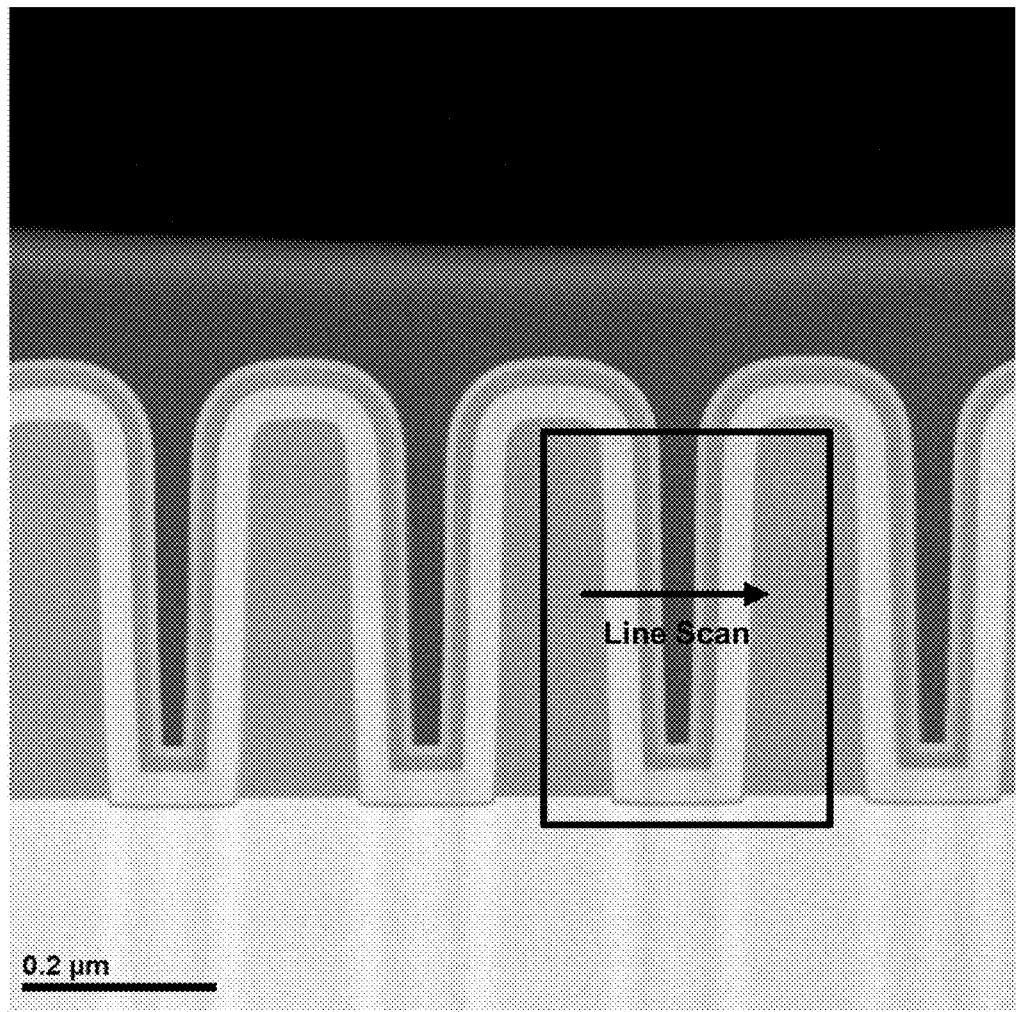
FIG. 7 illustrates a scanning transmission electron microscopy (STEM) image of an example oxygen doped silicon carbide (SiCO) film (graded or ungraded) deposited in a feature of a substrate.

Not only can a graded silicon carbide film be deposited with varying carbon concentration across its thickness, but the graded silicon carbide film can be deposited with good conformality in high aspect ratio features. In some embodiments, the graded silicon carbide film can be deposited in features having a depth to width aspect ratio of greater than 2:1, greater than 5:1, or greater than 10:1. Even in such high aspect ratio features, the graded silicon carbide film can have a step coverage of at least 80%, at least 85%, or at least 90%. Such step coverage can be useful in a variety of integrated circuit applications, such as in sidewall spacer applications. FIG. 7 illustrates a scanning transmission electron microscopy (STEM) image of an example SiCO film (graded or ungraded) deposited in a feature of a substrate. The SiCO film, whether it's graded or ungraded, maintains good conformality along sidewalls of the features. To measure elemental content in the features, an electron energy loss spectroscopy (EELS) operation is performed in a lateral direction.

Figure 8A:
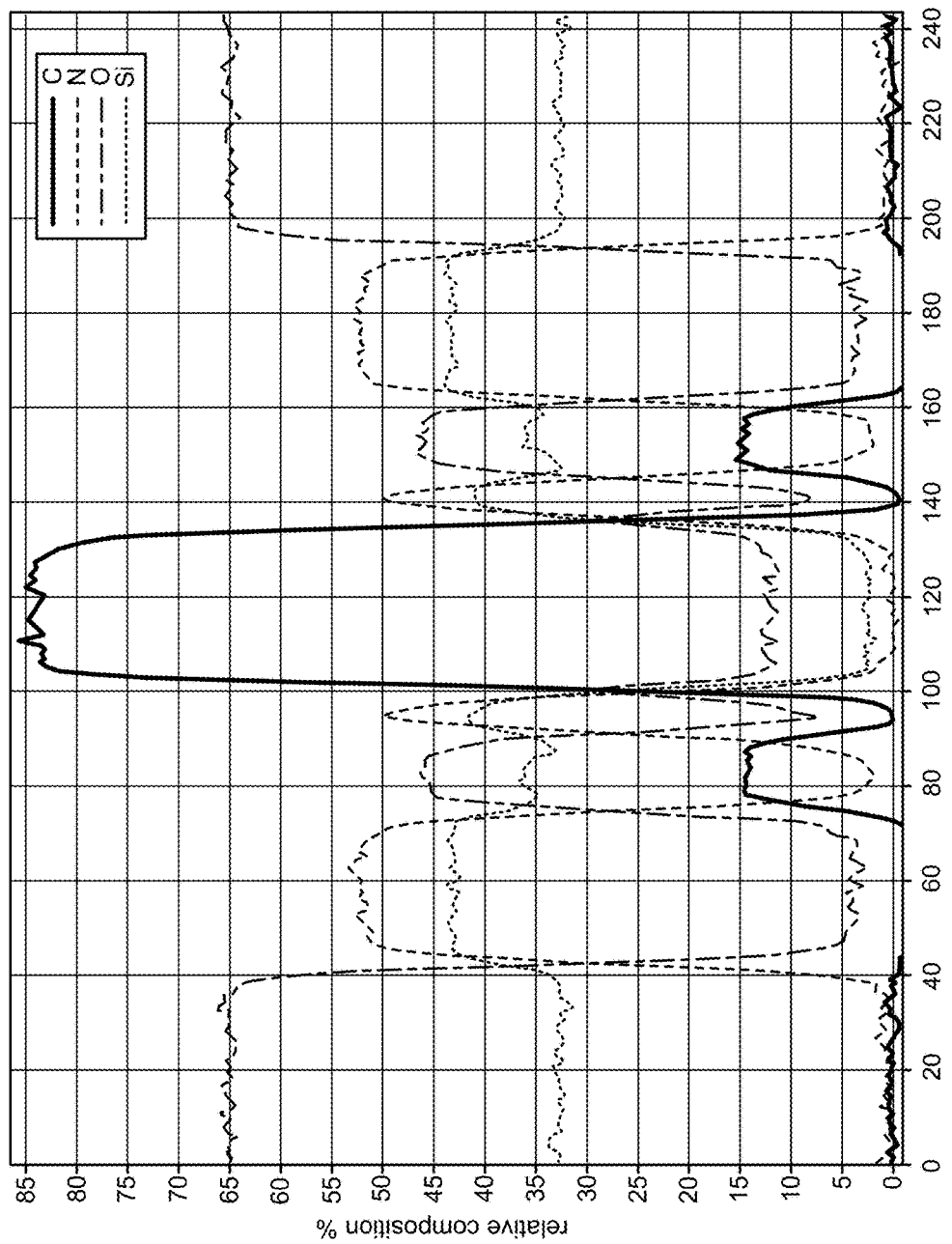
FIG. 8A illustrates a line scan graph of the STEM image of FIG. 7 showing a composition profile of an ungraded SiCO film.

FIG. 8A illustrates a line scan graph of the STEM image of FIG. 7 showing a composition profile of an ungraded SiCO film. In FIG. 8A, the composition profile of the ungraded SiCO film can be represented at depths between about 70 nm and about 90 nm, and at depths between about 140 nm and about 160 nm. The relative concentrations of carbon and oxygen are generally constant in the ungraded SiCO film.

Figure 8B:
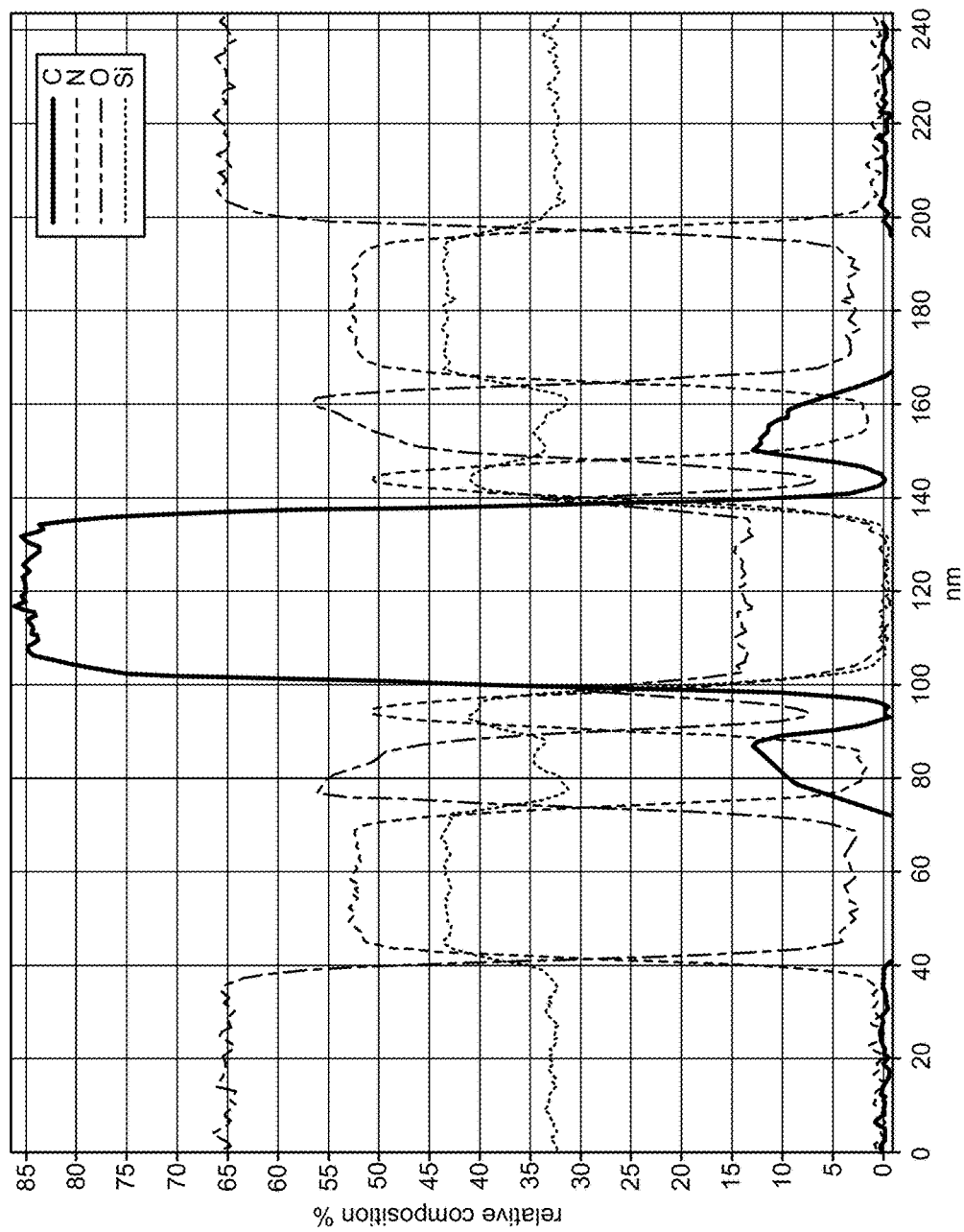
FIG. 8B illustrates a line scan graph of the STEM image of FIG. 7 showing a composition profile of a graded SiCO film.

FIG. 8B illustrates a line scan graph of the STEM image of FIG. 7 showing a composition profile of a graded SiCO film. In FIG. 8B, the composition profile of the graded SiCO film can be represented at depths between about 70 nm and about 90 nm, and at depths between about 145 nm and about 165 nm. The relative concentrations of carbon and oxygen are more sloped in the graded SiCO film. Specifically, the relative concentration of carbon decreases from an outer surface to an inner surface and the relative concentration of oxygen increases from the outer surface to the inner surface. Thus, as the number of Si—O bonds increase, the number of Si—C bonds decrease.

Apparatus

One aspect of the disclosure is an apparatus configured to accomplish the methods described herein. A suitable apparatus includes hardware for accomplishing the process operations and a system controller having instructions for controlling process operations in accordance with the present disclosure. In some embodiments, the apparatus for performing the aforementioned process operations can include a remote plasma source. A remote plasma source provides mild reaction conditions in comparison to a direct plasma. An example of a suitable remote plasma apparatus is described in U.S. patent application Ser. No. 14/062,648, filed Oct. 24, 2013, which is incorporated herein by reference in its entirety and for all purposes.

Figure 3:
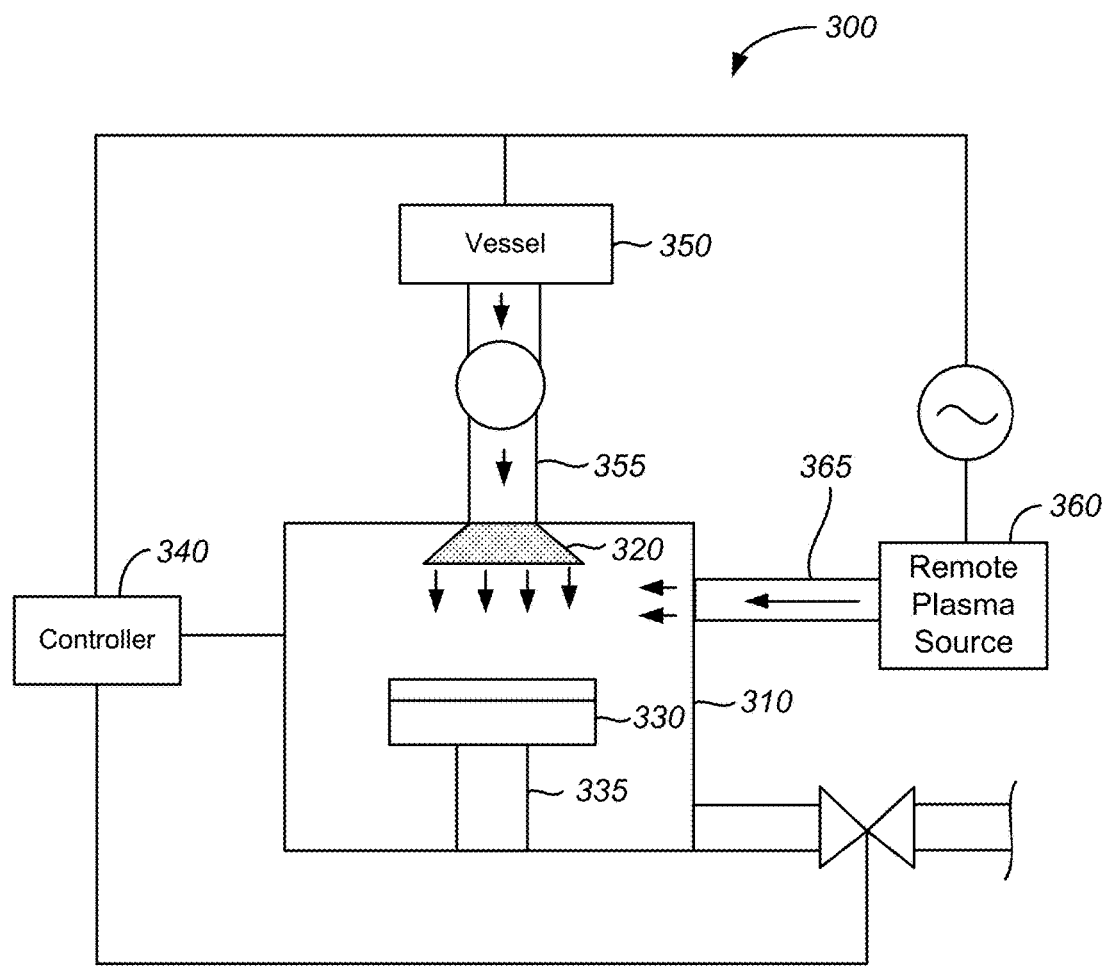
FIG. 3 illustrates a schematic diagram of an apparatus with a remote plasma source.

FIG. 3 presents a schematic diagram of a remote plasma apparatus according to certain embodiments. The device 300 includes a reaction chamber 310 with a showerhead assembly 320. Inside the reaction chamber 310, a substrate 330 rests on a stage or pedestal 335. In some embodiments, the pedestal 335 can be fitted with a heating/cooling element. A controller 340 may be connected to the components of the device 300 to control the operation of the device 300. For example, the controller 340 may contain instructions for controlling process conditions for the operations of the device 300, such as the temperature process conditions and/or the pressure process conditions. In some embodiments, the controller 340 may contain instructions for controlling the flow rates of precursor gas, co-reactant gas, source gas, and carrier gas. The controller 340 may contain instructions for changing the flow rate of the co-reactant gas over time. In addition or in the alternative, the controller 340 may contain instructions for changing the flow rate of the precursor gas over time.

During operation, gases or gas mixtures are introduced into the reaction chamber 310 via one or more gas inlets coupled to the reaction chamber 310. In some embodiments, two or more gas inlets are coupled to the reaction chamber 310. A first gas inlet 355 can be coupled to the reaction chamber 310 and connected to a vessel 350, and a second gas inlet 365 can be coupled to the reaction chamber 310 and connected to a remote plasma source 360. In embodiments including remote plasma configurations, the delivery lines for the precursors and the radical species generated in the remote plasma source are separated. Hence, the precursors and the radical species do not substantially interact before reaching the substrate 330.

One or more radical species may be generated in the remote plasma source 360 and configured to enter the reaction chamber 310 via the gas inlet 365. Any type of plasma source may be used in remote plasma source 360 to create the radical species. This includes, but is not limited to, capacitively coupled plasmas, inductively coupled plasmas, microwave plasmas, DC plasmas, and laser-created plasmas. An example of a capacitively coupled plasma can be a radio frequency (RF) plasma. A high-frequency plasma can be configured to operate at 13.56 MHz or higher. An example of such a remote plasma source 360 can be the GAMMA®, manufactured by Lam Research Corporation of Fremont, Calif. Another example of such a RF remote plasma source 360 can be the Astron®, manufactured by MKS Instruments of Wilmington, Mass., which can be operated at 440 kHz and can be provided as a subunit bolted onto a larger apparatus for processing one or more substrates in parallel. In some embodiments, a microwave plasma can be used as the remote plasma source 360, such as the Astex®, also manufactured by MKS Instruments. A microwave plasma can be configured to operate at a frequency of 2.45 GHz. Gas provided to the remote plasma source may include hydrogen, nitrogen, oxygen, and other gases as mentioned elsewhere herein. In certain embodiments, hydrogen is provided in a carrier such helium. As an example, hydrogen gas may be provided in a helium carrier at a concentration of about 1-10% hydrogen.

The precursors can be provided in vessel 350 and can be supplied to the showerhead 320 via the first gas inlet 355. The showerhead 320 distributes the precursors into the reaction chamber 310 toward the substrate 330. The substrate 330 can be located beneath the showerhead 320. It will be appreciated that the showerhead 320 can have any suitable shape, and may have any number and arrangement of ports for distributing gases to the substrate 330. The precursors can be supplied to the showerhead 320 and ultimately to the substrate 330 at a controlled flow rate.

The one or more radical species formed in the remote plasma source 360 can be carried in the gas phase toward the substrate 330. The one or more radical species can flow through a second gas inlet 365 into the reaction chamber 310. It will be understood that the second gas inlet 365 need not be transverse to the surface of the substrate 330 as illustrated in FIG. 3. In certain embodiments, the second gas inlet 365 can be directly above the substrate 330 or in other locations. The distance between the remote plasma source 360 and the reaction chamber 310 can be configured to provide mild reactive conditions such that the ionized species generated in the remote plasma source 360 are substantially neutralized, but at least some radical species in substantially low energy states remain in the environment adjacent to the substrate 330. Such low energy state radical species are not recombined to form stable compounds. The distance between the remote plasma source 360 and the reaction chamber 310 can be a function of the aggressiveness of the plasma (e.g., determined in part by the source RF power level), the density of gas in the plasma (e.g., if there's a high concentration of hydrogen atoms, a significant fraction of them may recombine to form $H_2$ before reaching the reaction chamber 310), and other factors. In some embodiments, the distance between the remote plasma source 360 and the reaction chamber 310 can be between about 1 cm and 30 cm, such as about 5 cm or about 15 cm.

In some embodiments, a co-reactant, which is not the primary silicon-containing precursor or a hydrogen radical, is introduced during the deposition reaction. In some implementations, the apparatus is configured to introduce the co-reactant through the second gas inlet 365, in which case the co-reactant is at least partially converted to plasma. In some implementations, the apparatus is configured to introduce the co-reactant through the showerhead 320 via the first gas inlet 355. Examples of the co-reactant include oxygen, nitrogen, ammonia, carbon dioxide, carbon monoxide, and the like. The flow rate of the co-reactant can vary over time to produce a composition gradient in a graded film.

The controller 340 may contain instructions for controlling process conditions for the operation of the device 300. The controller 340 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 340 or they may be provided over a network.

In certain embodiments, the controller 340 controls all or most activities of the semiconductor processing device 300 described herein. For example, the controller 340 may control all or most activities of the semiconductor processing device 300 associated with depositing a graded silicon carbide film and, optionally, other operations in a fabrication flow that includes the graded silicon carbide films. The controller 340 may execute system control software including sets of instructions for controlling the timing, gas composition, gas flow rates, chamber pressure, chamber temperature, RF power levels, substrate position, and/or other parameters. Other computer programs, scripts, or routines stored on memory devices associated with the controller 340 may be employed in some embodiments. To provide relatively mild reactive conditions at the environment adjacent to the substrate 330, parameters such as the RF power levels, gas flow rate to the remote plasma region, and timing of the plasma ignition can be adjusted and maintained by controller 340. Additionally, adjusting the substrate position may further reduce the presence of high-energy radical species at the environment adjacent to the substrate 330. In a multi-station reactor, the controller 340 may comprise different or identical instructions for different apparatus stations, thus allowing the apparatus stations to operate either independently or synchronously.

In some embodiments, the controller 340 may include instructions for performing operations such as flowing a silicon-containing precursor through the first gas inlet 355 into the reaction chamber 310, providing one or more radical species of a source gas in a substantially low energy state from the remote plasma source 360, flowing a co-reactant gas through the second gas inlet 365 into the reaction chamber 310, changing a flow rate of the co-reactant gas over time, and flowing the one or more radical species through the second gas inlet 365 into the reaction chamber 310 to react with the silicon-containing precursor to form the graded silicon carbide film on the substrate 330. In some implementations, the controller 340 may include instructions for changing a flow rate of the silicon-containing precursor over time In some embodiments, the apparatus may include a user interface associated with controller 340. The user interface may include a display screen, graphical software displays of the apparatus and/or process conditions, and user input devices such as pointing devices, keyboards, touch screens, microphones, etc.

The computer program code for controlling the above operations can be written in any conventional computer readable programming language: for example, assembly language, C, C++, Pascal, Fortran, or others. Compiled object code or script is executed by the processor to perform the tasks identified in the program.

Signals for monitoring the process may be provided by analog and/or digital input connections of the system controller. The signals for controlling the process are output on the analog and digital output connections of the processing system.

In general, the methods described herein can be performed on systems including semiconductor processing equipment such as a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. In general, the electronics are referred to as the controller, which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials (e.g., silicon carbide), surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In addition to the silicon carbide deposition described herein, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Applications

The present disclosure may be further understood by reference to the following applications for high-quality silicon carbide films, including graded silicon carbide films, for which the applications are intended to purely serve as examples. The present disclosure is not limited in scope by the specified applications, which are simply illustrations of aspects of the disclosure.

In some embodiments, a silicon carbide film may be deposited over exposed copper. In depositing the silicon carbide film, reaction conditions adjacent to the substrate can be free of oxidants, such as $O_2$, $O_3$, and $CO_2$, including radicals thereof. Thus, the silicon carbide film may be deposited directly over the exposed copper without oxidizing copper (e.g., creating cupric oxide). Such films can serve as etch stop layers, which can also serve as copper diffusion barriers. The presence of the silicon carbide film can provide a sufficiently low dielectric constant with excellent leakage properties to serve as a diffusion barrier. The silicon carbide film can be an etch stop and/or diffusion barrier either by itself, or as a bilayer stack (e.g., silicon carbide/SiNC bilayer deposited over exposed copper), or as a graded film (e.g., graded SiCO film) or multi-layer stack (e.g., multi-layered SiCO film). In some embodiments, the silicon carbide film can be placed in between adjacent metallization layers that are typically produced by a damascene process. The silicon carbide film can resist etching and can be sufficiently dense to minimize the diffusion of copper ions into adjacent regions of dielectric material. In some embodiments, the precursor employed for the silicon carbide film can be non-cyclic. Non-cyclic precursors can include PMDSO or TMDSO. The non-cyclic precursor can provide a sufficiently high density to serve as a hermetic or diffusion barrier. In some embodiments, nitrogen may be incorporated into the film by employing nitrogen-containing precursors or plasma activating nitrogen-containing radicals, such as elemental nitrogen radicals or amine radicals.

In some embodiments, a silicon carbide film may be deposited as vertical structures adjacent to metal or semiconductor structures. Deposition of silicon carbide provides excellent step coverage along sidewalls of the metal or semiconductor structures to create the vertical structures. In certain embodiments, the vertical structures may be referred to as spacers or liners. FIG. 1B illustrates a cross-section of silicon carbide liners deposited on the sidewalls of a gate electrode structure of a transistor. As illustrated in FIG. 1B, the transistor can be a CMOS transistor with a silicon substrate 110 having a source 112 and a drain 113. A gate dielectric 114 can be deposited over the silicon substrate 110, and a gate electrode can be deposited over the gate dielectric 115 to form the transistor. Silicon carbide liners 111 can be deposited on the sidewalls of the gate electrode 115 and gate dielectric 114. In another example, FIG. 1C illustrates a cross-section of silicon carbide deposited on sidewalls of exposed copper lines in an air gap type metallization layer. Air gaps 120 can be introduced into an integrated circuit layer between copper lines 122 that can reduce the effective k-value of the layer. Silicon carbide liners 121 can be deposited on the sidewalls of the copper lines 122, and a nonconformal dielectric layer 123 can be deposited the air gaps 120, liners 121, and copper lines 122. Examples of such air gap type metallization layers can be described in U.S. Patent Publication No. 2004/0232552 to Fei Wang et al., which is herein incorporated by reference in its entirety and for all purposes.

In some embodiments, a silicon carbide film may be deposited on the sidewalls of patterned porous dielectric materials. Ultra low-k dielectric materials can be made from a porous structure. The pores in such materials can provide areas for ingress of metal during deposition of subsequent layers, including the deposition of diffusion barriers containing a metal such as tantalum (Ta). If too much metal migrates into the dielectric material, the dielectric material may provide a short circuit between adjacent copper metallization lines. FIG. 1D illustrates a cross-section of silicon carbide as a pore sealant for porous dielectric materials. A porous dielectric layer 132 can have a plurality of trenches or vias cut into the porous dielectric layer 132 to form pores 130. Silicon carbide 131 can be deposited along the pores 130 to effectively seal the pores 130. Sealing the pores 130 with the silicon carbide 131 can avoid damaging the porous dielectric layer 132 that may otherwise be incurred by other sealing techniques using a plasma. The silicon carbide 131 can be sufficiently dense as a pore sealant and may include non-cyclic silicon-containing precursors, such as PMDSO and TMDSO. In some embodiments, an etched dielectric material such as the porous dielectric layer 132 may first be treated by a "k-recovery" process, which exposes the porous dielectric layer 132 to UV radiation and a reducing agent. This recovery process is further described in commonly owned U.S. Patent Publication No. 2011/0111533 to Varadarajan et al., which is incorporated by reference herein in its entirety and for all purposes. In another "k-recovery" process, the porous dielectric layer 132 can be exposed to UV radiation and a chemical silylating agent. This recovery process is further described in commonly owned U.S. Patent Publication No. 2011/0117678 to Varadarajan et al., which is incorporated by reference herein in its entirety and for all purposes. After exposing the pores 130 to the recovery treatment, which makes the surface more hydrophilic and provides a monolayer of material, a layer of conformally deposited silicon carbide 131 can be deposited to effectively seal the pores of the porous dielectric layer 132.

In some embodiments, a silicon carbide film may be deposited as an ultra low-k dielectric material itself. Ultra low-k dielectrics are conventionally defined as those materials that have a dielectric constant lower than that of 2.5. In such configurations, the ultra low-k dielectric material of silicon carbide can be a porous dielectric layer. The pores of the dielectric layer can be introduced by using cyclic or caged precursor molecules, including the cyclic siloxanes and silsesquioxanes. In one example, the porosity of the ultra low-k dielectric layer of silicon carbide can be between about 20% and 50%. Further, the ultra low-k dielectric layer can have an average pore size of less than about 100 Å, such as between about 5 Å and 20 Å. For example, a cyclosiloxane ring can have a radius of about 6.7 Å. While increasing the number and size of the pores can lower the dielectric constant, the mechanical integrity of the dielectric layer can be compromised if it is too porous.

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. A method of depositing a graded silicon carbide film, the method comprising:
providing a substrate in a reaction chamber;
flowing an organosilicon precursor onto the substrate;
flowing a co-reactant gas towards the reaction chamber;
providing a source gas in a plasma source that is remote from the reaction chamber;
generating, from the source gas, one or more radicals of the source gas in the plasma source;
introducing the one or more radicals of the source gas onto the substrate, wherein the one or more radicals of the source gas are in a ground state, wherein the co-reactant gas and the one or more radicals of the source gas in the ground state react with the organosilicon precursor to deposit a silicon carbide film; and
changing a flow rate of the co-reactant gas over time to form a graded silicon carbide film from the silicon carbide film, the graded silicon carbide film having a composition gradient from a first surface of the graded silicon carbide film to a second surface opposite the first surface of the graded silicon carbide film.

2. The method of claim 1, wherein flowing the co-reactant gas towards the reaction chamber includes flowing the co-reactant gas through the plasma source.

3. The method of claim 2, further comprising:
generating, from the co-reactant gas, one or more radicals of the co-reactant gas in the plasma source; and
introducing the one or more radicals of the co-reactant gas onto the substrate.

4. The method of claim 1, wherein flowing the co-reactant gas towards the reaction chamber includes flowing the co-reactant gas in an identical flow path as the organosilicon precursor.

5. The method of claim 1, wherein the co-reactant gas includes carbon dioxide ($CO_2$), carbon monoxide (CO), water ($H_2O$), methanol ($CH_3OH$), oxygen ($O_2$), ozone ($O_3$), nitrogen ($N_2$), nitrous oxide ($N_2O$), ammonia ($NH_3$), diazene ($N_2H_2$), methane ($CH_4$), ethane ($C_2H_6$), acetylene ($C_2H_2$), ethylene ($C_2H_4$), diborane ($B_2H_6$), or combinations thereof.

6. The method of claim 5, wherein the co-reactant gas is oxygen gas.

7. The method of claim 1, wherein the graded silicon carbide film is a graded oxygen doped silicon carbide (SiCO) film.

8. The method of claim 1, wherein the composition gradient of the graded silicon carbide film has an increasing concentration of carbon from the first surface to the second surface of the graded silicon carbide film.

9. The method of claim 8, wherein the concentration of carbon at the first surface of the graded silicon carbide film is less than about 20% and the concentration of carbon at the second surface of the graded silicon carbide film is greater than about 20%.

10. The method of claim 8, wherein the second surface has a higher etch selectivity to oxide/nitride, a higher resistance to ash and strip, and a higher resistance to steam annealing than the first surface of the graded silicon carbide film.

11. The method of claim 8, wherein the second surface has a higher dielectric constant than the first surface of the graded silicon carbide film.

12. The method of claim 1, wherein the graded silicon carbide film is formed without introducing a vacuum break.

13. The method of claim 1, wherein changing the flow rate of the co-reactant gas over time includes gradually changing the flow rate of the co-reactant gas across a thickness of the graded silicon carbide film.

14. The method of claim 1, wherein all or substantially all of the one or more radicals of the source gas in the ground state include hydrogen atom radicals.

15. The method of claim 14, wherein at least 90% of the one or more radicals of the source gas are hydrogen atom radicals in the ground state.

16. The method of claim 1, wherein the organosilicon precursor includes: (i) one or more silicon-hydrogen bonds and/or silicon-silicon bonds, (ii) one or more silicon-carbon bonds, and (iii) one or more silicon-oxygen bonds.

17. The method of claim 16, wherein the organosilicon precursor is selected from a group consisting of: a cyclic siloxane, a linear siloxane, and an alkoxy silane.

18. The method of claim 1, wherein the substrate has a plurality of features, each of the features having a depth to width aspect ratio of greater than 5:1.

19. The method of claim 1, wherein changing the flow rate of the co-reactant gas over time occurs without changing a flow rate of the organosilicon precursor or a flow rate of the source gas.

20. The method of claim 1, further comprising:
 changing a flow rate of the organosilicon precursor over time.

* * * * *